US011514863B1

(12) United States Patent
 Lim

(10) Patent No.: US 11,514,863 B1
(45) Date of Patent: Nov. 29, 2022

(54) DISPLAY DEVICE

(71) Applicant: Samsung Display Co., Ltd., Yongin-si (KR)

(72) Inventor: Sanghyun Lim, Cheonan-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 17/697,132

(22) Filed: Mar. 17, 2022

(30) Foreign Application Priority Data

Jun. 2, 2021 (KR) .......................... 10-2021-0071613

(51) Int. Cl.
  *G09G 3/3266* (2016.01)
  *G09G 3/3275* (2016.01)
  *G06F 3/044* (2006.01)

(52) U.S. Cl.
  CPC .......... *G09G 3/3266* (2013.01); *G06F 3/044* (2013.01); *G09G 3/3275* (2013.01); *G09G 2310/08* (2013.01); *G09G 2320/0233* (2013.01)

(58) Field of Classification Search
  CPC ..... G06F 3/044; G06F 3/0412; G09G 3/3266; G09G 3/3275; G09G 2310/08; G09G 2320/0233
  See application file for complete search history.

(56) References Cited

U.S. PATENT DOCUMENTS

| 10,861,391 | B2 | 12/2020 | Yan |
| 11,011,592 | B2 | 5/2021 | Kim et al. |
| 2018/0330672 | A1 | 11/2018 | Park et al. |

FOREIGN PATENT DOCUMENTS

| KR | 1020180125081 A | 11/2018 |
| KR | 1020190081959 A | 7/2019 |

*Primary Examiner* — Michael Pervan
(74) *Attorney, Agent, or Firm* — Cantor Colburn LLP

(57) ABSTRACT

A display device includes a display panel including a plurality of pixels for displaying an image and a plurality of data lines electrically connected with the pixels, and a panel driving block that receives an image signal from an outside and transmits a data signal to the display panel through the data lines. The display panel includes a plurality of impedance control units that are electrically connected with the data lines, respectively, and adjusts an impedance of each of the data lines in response to an impedance control signal.

32 Claims, 15 Drawing Sheets

DISPLAY DEVICE

This application claims priority to Korean Patent Application No. 10-2021-0071613, filed on Jun. 2, 2021, and all the benefits accruing therefrom under 35 U.S.C. § 119, the content of which in its entirety is herein incorporated by reference herein.

BACKGROUND

1. Field

The disclosure relates to a display device, and more particularly, relates to a display device with improved display quality.

2. Description of the Related Art

Various types of display devices are being used to provide image information. In particular, an organic light-emitting display ("OLED") device, an inorganic light-emitting display device, a liquid crystal display ("LCD") device, a plasma display device, etc. are being used as a display device.

The display device typically includes a display panel that displays an image and a panel driving block that is coupled to the display panel to provide a driving signal to the display panel. The display panel includes pixels that generate a light. A light-emitting display device includes a light-emitting diode that generates a light.

The display device may include an input sensing layer capable of sensing an input applied from an outside.

SUMMARY

Embodiments of the disclosure provide a display device with an image quality improved by preventing the luminance of the display device from being distorted.

According to an embodiment, a display device includes a display panel including a plurality of pixels which displays an image and a plurality of data lines electrically connected with the pixels. In such an embodiment, the display device includes a panel driving block which receives an image signal from an outside and transmits data signals to the display panel through the data lines. In such an embodiment, the display panel includes a plurality of impedance control units electrically connected with the data lines, respectively, where the impedance control units adjust an impedance of each of the data lines in response to an impedance control signal.

In an embodiment of the disclosure, the impedance control signal may control the impedance control units based on a timing when the data signals are applied to the pixels.

In an embodiment of the disclosure, the impedance control signal may include a first control signal. In such an embodiment, each of the impedance control units may include a first control transistor connected with a corresponding data line among the data lines, where the first control transistor may operate in response to the first control signal, and a resistor part connected in parallel with the first control transistor.

In an embodiment of the disclosure, a first electrode of the first control transistor may be electrically connected with a first end of the resistor part, and a second electrode of the first control transistor may be electrically connected with a second end of the resistor part. In such an embodiment, a control electrode of the first control transistor may be electrically connected with a first impedance control line which receives the first control signal. In such an embodiment, the first control transistor may be turned off in a first control period of the first control signal and may be turned on in a first non-control period of the first control signal.

In an embodiment of the disclosure, the impedance control units may have a first impedance in the first control period and have a second impedance smaller than the first impedance in the first non-control period.

In an embodiment of the disclosure, the resistor part may include a main resistor connected between the first electrode of the first control transistor and the second electrode of the first control transistor.

In an embodiment of the disclosure, the resistor part may further include a plurality of resistor adjusting parts connected between the first electrode of the first control transistor and the second electrode of the first control transistor. In such an embodiment, each of the resistor adjusting parts may include a sub-resistor connected between the first electrode of the first control transistor and the second electrode of the first control transistor, and a sub-transistor connected between the second electrode of the first control transistor and the sub-resistor.

In an embodiment of the disclosure, a control electrode of the sub-transistor may be electrically connected with a resistor control line which receives a resistor control signal.

In an embodiment of the disclosure, the impedance control signal further includes a second control signal. In such an embodiment, each of the impedance control units further includes a second control transistor connected in parallel with the corresponding data line, where the second control transistor may operate in response to the second control signal, and a capacitor connected with the second control transistor. In such an embodiment, a first electrode of the second control transistor may be electrically connected with the corresponding data line, and a second electrode of the second control transistor may be electrically connected with the capacitor.

In an embodiment of the disclosure, a control electrode of the second control transistor may be electrically connected with a second impedance control line which receives the second control signal. In such an embodiment, the second control transistor may be turned on in a second control period of the second control signal and may be turned off in a second non-control period of the second control signal.

In an embodiment of the disclosure, in an overlapping period in which the first control period and the second control period overlap each other, each of the data lines may be electrically connected with the resistor part and the capacitor.

In an embodiment of the disclosure, each of the impedance control units may further include a second control transistor connected in parallel with the corresponding data line, where the second control transistor may operate in response to the first control signal, and a capacitor connected with the second control transistor. In such an embodiment, a first electrode of the second control transistor may be electrically connected with the corresponding data line, and a second electrode of the second control transistor may be electrically connected with the capacitor.

In an embodiment of the disclosure, a control electrode of the second control transistor may be electrically connected with the first impedance control line. In such an embodiment, the second control transistor may be turned on in the first control period of the first control signal and may be turned off in the first non-control period of the first control signal.

In an embodiment of the disclosure, in the first control period, each of the data lines may be electrically connected with the resistor part and the capacitor.

In an embodiment of the disclosure, each of the impedance control units may include a control transistor connected with a corresponding data line among the data lines, where the control transistor may operate in response to the impedance control signal, and a capacitor connected with the control transistor. In such an embodiment, a first electrode of the control transistor may be electrically connected with the corresponding data line, and a second electrode of the control transistor may be electrically connected with the capacitor.

In an embodiment of the disclosure, a control electrode of the control transistor may be electrically connected with an impedance control line which receives the impedance control signal. In such an embodiment, the control transistor may be turned on in a control period of the impedance control signal and may be turned off in a non-control period of the impedance control signal.

In an embodiment of the disclosure, the impedance control units may have a first impedance in the control period and have a second impedance smaller than the first impedance in the non-control period.

In an embodiment of the disclosure, the display panel may include a display area in which the pixels are disposed and a non-display area adjacent to the display area. In such an embodiment, the impedance control units may be disposed in the non-display area.

In an embodiment of the disclosure, the panel driving block may include a controller which generates a source control signal and a gate control signal and generates image data based on the image signal. In such an embodiment, the panel driving block may include a source driving block which receives the source control signal and the image data from the controller and generates the data signal based on the image data. In such an embodiment, the impedance control units may be disposed between the source driving block and the pixels.

In an embodiment of the disclosure, the display panel may further include a plurality of scan lines electrically connected with the pixels, respectively. In such an embodiment, the panel driving block may further include a gate driving block which sequentially transmits a scan signal, which is generated based on the gate control signal, to the display panel through the scan lines. In such an embodiment, the gate driving block may transmit the impedance control signal to the impedance control units.

In an embodiment of the disclosure, the impedance control units may have a first impedance in a control period of the impedance control signal and has a second impedance smaller than the first impedance in a non-control period of the impedance control signal. In such an embodiment, the control period may overlap a scan period of the scan signal.

In an embodiment of the disclosure, the scan period may be included in the control period.

In an embodiment of the disclosure, the display panel may include a base layer, a circuit element layer disposed on the base layer and including a plurality of driving transistors for driving a light-emitting element, and a display element layer disposed on the circuit element layer and including the light-emitting element. In such an embodiment, each of the impedance control units may include an impedance part, and a control transistor which controls the impedance part. In such an embodiment, the impedance part and the control transistor may be disposed in the circuit element layer.

In an embodiment of the disclosure, the impedance part may be disposed in a same layer as a semiconductor pattern of a driving transistor among the driving transistors.

In an embodiment of the disclosure, the impedance part may include polysilicon.

In an embodiment of the disclosure, the impedance part may include metal oxide.

According to an embodiment, a display device includes a display panel that includes a plurality of pixels which displays an image and a plurality of data lines electrically connected with the pixels. In such an embodiment, the display device includes an input sensing layer disposed on the display panel, where the input sensing layer senses an input applied from an outside and a panel driving block which receives an image signal from the outside and transmits a data signal to the display panel through the data lines. In such an embodiment, the display panel includes a plurality of impedance control units electrically connected with the data lines, respectively, where the impedance control units adjust an impedance of each of the data lines in response to an impedance control signal.

In an embodiment of the disclosure, the display panel may include a display element layer including a light-emitting element, and an encapsulation layer disposed on the display element layer.

In an embodiment of the disclosure, the input sensing layer may be disposed directly on the encapsulation layer.

In an embodiment of the disclosure, the display panel may include a display area in which the pixels are disposed and a non-display area adjacent to the display area. In such an embodiment, the impedance control units may be disposed in the non-display area.

In an embodiment of the disclosure, the panel driving block may include a controller which generates a source control signal and a gate control signal and generates image data based on the image signal. In such an embodiment, the panel driving block may include a source driving block which receives the source control signal and the image data from the controller and generates the data signal based on the image data. In such an embodiment, the impedance control units may be disposed between the source driving block and the pixels.

In an embodiment of the disclosure, the display panel may further include a plurality of scan lines electrically connected with the pixels. In such an embodiment, the panel driving block further includes a gate driving block which sequentially transmits a scan signal, which is generated based on the gate control signal, to the display panel through the scan lines. In such an embodiment, the data signals may be applied to the pixels in a scan period of the scan signal.

BRIEF DESCRIPTION OF THE DRAWINGS

The above and other features of the disclosure will become apparent by describing in detail embodiments thereof with reference to the accompanying drawings.

DETAILED DESCRIPTION

Figure 1:
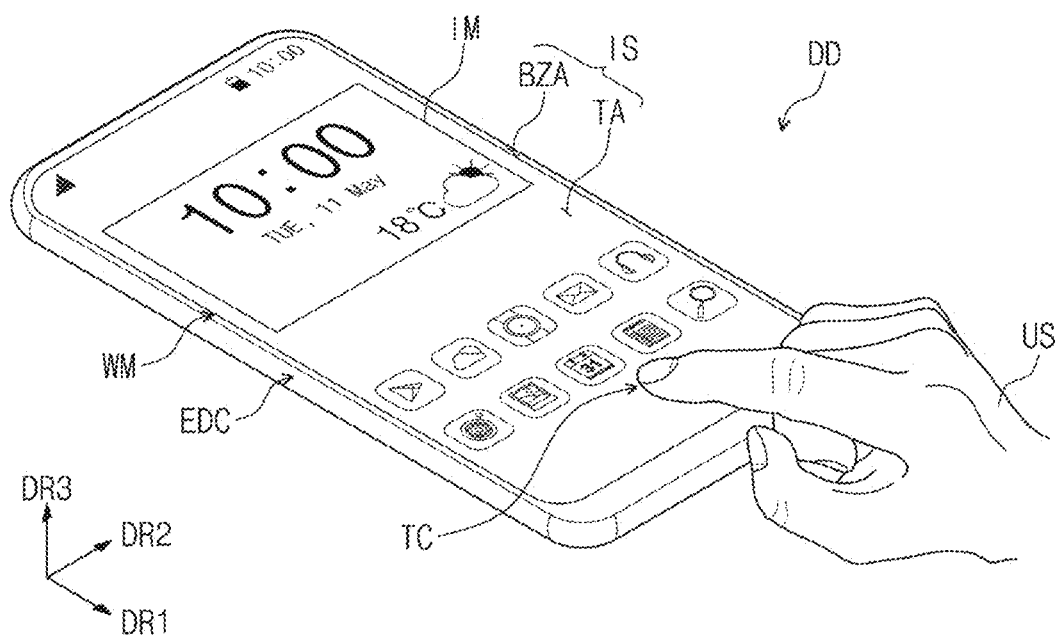
FIG. 1 is a perspective view of a display device according to an embodiment of the disclosure.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

In the specification, the expression that a first component (or region, layer, part, portion, etc.) is "on", "connected with", or "coupled with" a second component means that the first component is directly on, connected with, or coupled with the second component or means that a third component is interposed therebetween.

Like reference numerals refer to like elements throughout. Also, in drawings, thicknesses, proportions, and dimensions of components may be exaggerated to describe the technical features effectively.

Although the terms "first", "second", etc. may be used to describe various components, the components should not be construed as being limited by the terms. The terms are only used to distinguish one component from another component. For example, without departing from the scope and spirit of the invention, a first component may be referred to as a second component, and similarly, the second component may be referred to as the second component.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical terms and scientific terms) used in the specification have the same meaning as commonly understood by one skilled in the art to which the disclosure belongs. Furthermore, terms such as terms defined in the dictionaries commonly used should be interpreted as having a meaning consistent with the meaning in the context of the related technology, and should not be interpreted in ideal or overly formal meanings unless explicitly defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the disclosure will be described in detail with reference to accompanying drawings.

Figure 2:
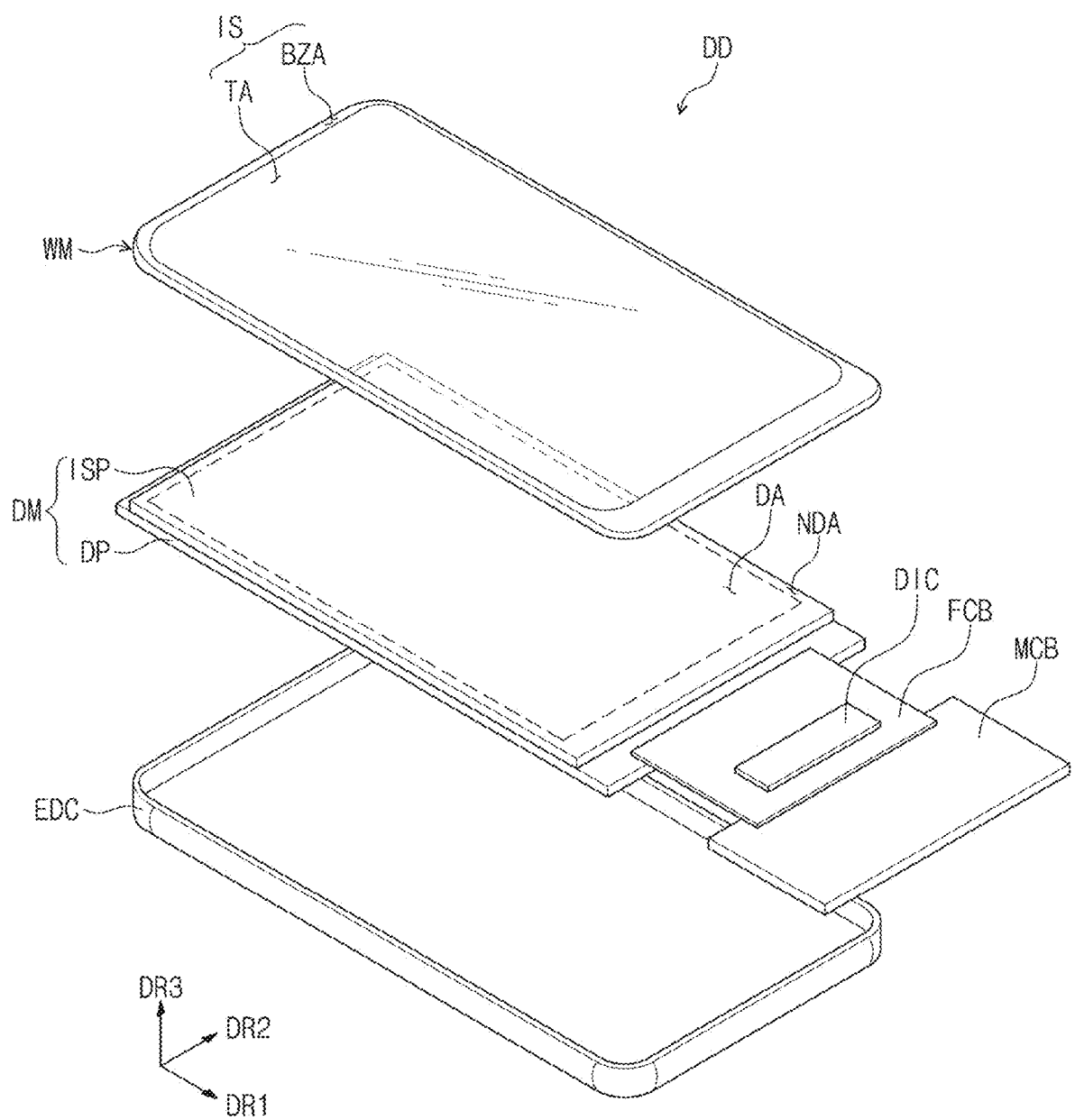
FIG. 2 is an exploded perspective view of a display device illustrated in FIG. 1.

FIG. 1 is a perspective view of a display device according to an embodiment of the disclosure, and FIG. 2 is an exploded perspective view of a display device illustrated in FIG. 1.

Referring to FIGS. 1 and 2, an embodiment of a display device DD may be a device that is activated based on an electrical signal. In an embodiment, the display device DD may be a small and medium-sized electronic device, such as a mobile phone, a tablet, a vehicle navigation system, or a game console, as well as a large-sized electronic device, such as a television or a monitor, for example. Alternatively, the display device DD may be applied to any other electronic device(s) without departing from the concept of the disclosure.

In an embodiment, the display device DD is in the shape of a rectangle having a long edge in a first direction DR1 and a short edge in a second direction DR2 intersecting the first direction DR1. However, the shape of the display device DD is not limited thereto. In one embodiment, for example, the display device DD may be implemented in various shapes. The display device DD may display an image IM on a display surface IS defined on a plane parallel to the first direction DR1 and the second direction DR2, to face a third direction DR3. Here, the third direction DR3 may be a thickness direction of the display device DD. The display surface IS on which the image IM is displayed may correspond to a front surface of the display device DD.

In an embodiment, a front surface (or an upper/top surface) and a rear surface (or a lower/bottom surface) of each member are defined based on a direction in which the image IM is displayed. The front surface and the rear surface may be opposite to each other in the third direction DR3, and a normal direction of each of the front surface and the rear surface may be parallel to the third direction DR3.

A separation distance between the front surface and the rear surface in the third direction DR3 may correspond to a thickness of the display device DD in the third direction DR3. Herein, directions that the first, second, and third directions DR1, DR2, and DR3 indicate may be relative in concept and may be changed to different directions.

The display device DD may sense an external input applied from the outside. The external input may include various types of inputs that are provided from the outside of the display device DD. The display device DD according to an embodiment of the disclosure may sense an external input TC of a user US, which is applied from the outside. The external input TC of the user US may be one of various types of external inputs, such as a part of the user's body, light, heat, and pressure, or a combination thereof. In an embodiment, an example in which the external input TC of the user US is a touch input by a hand of the user US is described, but the disclosure is not limited thereto. In one embodiment, for example, as described above, the external input TC of the user US may be provided in various types. Also, the display device DD may sense the external input TC of the user US applied to a side surface or a rear surface of the display device DD depending on a structure of the display device DD and is not limited to one embodiment.

The front surface of the display device DD may be divided into a transparent area TA and a bezel area BZA. The transparent area TA may be an area in which the image IM is displayed. The user US perceives the image IM through the transparent area TA. In an embodiment, as shown in FIG. 1 the transparent area TA may be in the shape of a quadrangle whose vertexes are rounded. However, this is illustrated as one embodiment. Alternatively, the transparent area TA may have various shapes, but not being limited to any one embodiment.

The bezel area BZA is adjacent to the transparent area TA. The bezel area BZA may have a predetermined color. The bezel area BZA surrounds the transparent area TA. In such an embodiment, a shape of the transparent area TA may be defined substantially by the bezel area BZA. However, this is illustrated as one embodiment. The bezel area BZA may be disposed adjacent to only one side of the transparent area TA or may be omitted. Embodiments of the display device DD may be variously modified and not limited to any one embodiment.

In an embodiment, as illustrated in FIG. 2, the display device DD may include a display module DM and a window WM disposed on the display module DM. The display module DM may include a display panel DP that displays an image based on an electrical signal and an input sensing layer ISP that transmits/receives information about an external input.

In an embodiment, the display panel DP may be a light-emitting display panel. The display panel DP may be, for example, an organic light-emitting display panel, an inorganic light-emitting display panel, or a quantum dot light-emitting display panel. An emission layer of the organic light-emitting display panel may include an organic light-emitting material. An emission layer of the inorganic light-emitting display panel may include an inorganic light-emitting material. An emission layer of the quantum dot light-emitting display panel may include a quantum dot, a quantum rod, etc. Hereinafter, for convenience of description, embodiments where the display panel DP is an organic light-emitting display panel will be described in detail.

The display panel DP may output the image IM, and the output image IM may be displayed through the display surface IS.

The input sensing layer ISP may be disposed on the display panel DP to sense the external input TC. A configuration and an operation of the input sensing layer ISP will be described later in greater detail with reference to FIGS. 5 and 6.

The window WM may include or be formed of a transparent material capable of outputting the image IM. In one embodiment, for example, the window WM may include or be formed of glass, sapphire, plastic, etc. In one embodiment, for example, the window WM may be implemented with a single layer, but the disclosure is not limited thereto. In one alternative embodiment, for example, the window WM may include a plurality of layers.

In an embodiment, although not illustrated in drawings, the bezel area BZA of the display device DD described above may correspond to an area that is defined by printing a material having a predetermined color on one area of the window WM. In an embodiment, the window WM may include a light blocking pattern for defining the bezel area BZA. The light blocking pattern that is a colored organic film may be formed, for example, in a coating manner.

The window WM may be coupled to the display module DM through an adhesive film. In one embodiment, for example, the adhesive film may include an optically clear adhesive ("OCA") film. However, the adhesive film is not limited thereto. In one alternative embodiment, for example, the adhesive film may include a typical adhesive or sticking agent. In one alternative embodiment, for example, the adhesive film may include an optically clear resin ("OCR") film or a pressure sensitive adhesive ("PSA") film.

An anti-reflection layer may be further disposed between the window WM and the display module DM. The anti-reflection layer decreases reflectivity of an external light incident from above the window WM. In an embodiment, the anti-reflection layer may include a retarder and a polarizer. The retarder may be a retarder of a film type or a liquid crystal coating type and may include a $\lambda/2$ retarder and/or a $\lambda/4$ retarder. The polarizer may also be a polarizer of a film type or a liquid crystal coating type. The film type may include a stretch-type synthetic resin film, and the liquid crystal coating type may include liquid crystals arranged in a predetermined direction. The retarder and the polarizer may be implemented with one polarization film.

In one embodiment, for example, the anti-reflection layer may also include color filters. An array of color filters may be determined in consideration of colors of lights that a plurality of pixels PX11 to PXnm (refer to FIG. 4) included in the display panel DP generate. In an embodiment, the anti-reflection layer may further include a light blocking pattern.

The display panel DP may be defined by a display area DA and a non-display area NDA. The display area DA may be defined as an area through which an image provided from the display panel DP is output. Also, the display area DA may be defined as an area in which the input sensing layer ISP senses the external input TC applied from the outside.

The non-display area NDA is adjacent to the display area DA. In one embodiment, for example, the non-display area NDA may surround the display area DA. However, this is illustrated as one embodiment. Alternatively, the non-display area NDA may be defined in various shapes, but not being limited to any one embodiment. According to an embodiment, the display area DA of the display panel DP may correspond to at least a portion of the transparent area TA.

The display module DM may include a main circuit board MCB, a flexible circuit film FCB, and a driver chip DIC. The main circuit board MCB may be connected with the flexible circuit film FCB to be electrically connected with the display panel DP. The flexible circuit film FCB may be connected with the display panel DP such that the display panel DP and the main circuit board MCB are electrically connected to each other.

The main circuit board MCB may include a plurality of driver devices. The plurality of driver devices may include a circuit unit for driving the display panel DP. The driver chip DIC may be mounted on the flexible circuit film FCB. In an embodiment, the display device DD may include a single flexible circuit film FCB, but embodiments of the disclosure are not limited thereto. In one alternative embodiment, for example, the display device DD may include a plurality of flexible circuit films capable of being connected with the display panel DP. An embodiment having a structure in which the driver chip DIC is mounted on the flexible circuit film FCB is illustrated in FIG. 2, but embodiments of the disclosure are not limited thereto. In one embodiment, for example, the driver chip DIC may be directly mounted on the display panel DP. In such an embodiment, a portion of the display panel DP, on which the driver chip DIC is mounted, may be bent such that the driver chip DIC is disposed on a rear surface of the display module DM. In an alternative embodiment, the driver chip DIC may be directly mounted on the main circuit board MCB.

In an embodiment, the input sensing layer ISP may be electrically connected with the main circuit board MCB through the flexible circuit film FCB. However, embodiments of the disclosure are not limited thereto. Alternatively, the display module DM may additionally include a separate flexible circuit film for electrically connecting the input sensing layer ISP and the main circuit board MCB.

The display device DD further includes an outer case EDC that accommodates the display module DM. The outer case EDC may be coupled with the window WM to define the exterior of the display device DD. The outer case EDC may absorb external shocks and may prevent a foreign material/moisture or the like infiltrated into the display module DM such that components accommodated in the outer case EDC are protected. In one embodiment, for example, the outer case EDC may be provided in the form of a combination of a plurality of accommodating members.

In an embodiment, the display device DD may further include an electronic module including various functional modules for operating the display module DM, a power supply module for supplying a power necessary for overall operations of the display device DD, a bracket coupled with the display module DM and/or the outer case EDC to partition an inner space of the display device DD, etc.

Figure 3:
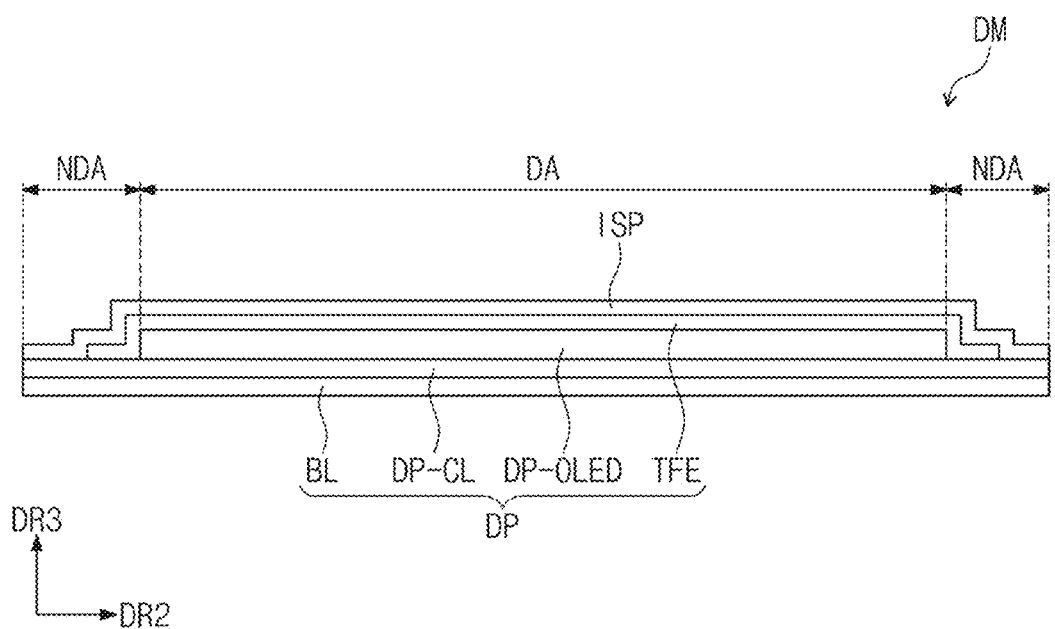
FIG. 3 is a cross-sectional view of a display module illustrated in FIG. 2.

FIG. 3 is a cross-sectional view of a display module illustrated in FIG. 2.

Referring to FIG. 3, an embodiment of the display module DM includes the display panel DP and the input sensing layer ISP. The display panel DP includes a base layer BL, a circuit element layer DP-CL disposed on the base layer BL, a display element layer DP-OLED, and an encapsulation layer TFE. Although not illustrated in drawings, the display panel DP may further include functional layers such as an anti-reflection layer and a refractive index control layer.

The base layer BL may include a plastic film. The base layer BL may include a plastic substrate, a glass substrate, a metal substrate, or an organic/inorganic composite substrate. In one embodiment, for example, the base layer BL may be a flexible substrate. Both the display area DA and the non-display area NDA described with reference to FIG. 2 may be defined in the base layer BL.

The circuit element layer DP-CL includes at least one intermediate insulating layer and a circuit element. The intermediate insulating layer includes at least one intermediate inorganic layer and at least one intermediate organic layer. The circuit element includes signal lines, a driving circuit of a pixel, etc.

The display element layer DP-OLED includes a light-emitting element. The light-emitting element may include organic light-emitting diodes. The display element layer DP-OLED may further include an organic film such as a pixel defining film.

The encapsulation layer TFE seals the display element layer DP-OLED. The encapsulation layer TFE includes at least one inorganic layer. The encapsulation layer TFE may further include at least one organic layer. The inorganic layer protects the display element layer DP-OLED from moisture/oxygen, and the organic layer protects the display element layer DP-OLED from a foreign material such as a dust particle. The inorganic layer may include a silicon nitride layer, a silicon oxynitride layer and a silicon oxide layer, a titanium oxide layer, or an aluminum oxide layer. The organic layer may include, but is not limited to, an acrylic-based organic layer.

In an embodiment, the display panel DP may further include an encapsulation substrate. The encapsulation substrate may be disposed on the display element layer DP-OLED to face the base layer BL. The display element layer DP-OLED may include a plastic substrate, a glass substrate, a metal substrate, or an organic/inorganic composite material substrate. A sealant may be disposed between the encapsulation substrate and the base layer BL, and the encapsulation substrate and the base layer BL may be coupled to each other by the sealant. The sealant may include an organic adhesive or a frit being a ceramic adhesive material. The display element layer DP-OLED may be sealed by the sealant and the encapsulation substrate.

In an embodiment, the input sensing layer ISP may be formed on the display panel DP by a continuous process. In an embodiment, the input sensing layer ISP and the display panel DP may be coupled to each other through an adhesive film. The input sensing layer ISP may have a multilayer structure. The input sensing layer ISP may include a single insulating layer or multiple insulating layers. According to an embodiment of the disclosure, where the input sensing layer ISP is directly disposed on the display panel DP by a continuous process, the input sensing layer ISP is directly disposed on the encapsulation layer TFE, and an adhesive film is not disposed between the input sensing layer ISP and the display panel DP. In one alternative embodiment, for example, an adhesive film may be disposed between the input sensing layer ISP and the display panel DP. In such an embodiment, the input sensing layer ISP is not manufactured by a process continuous to that of the display panel DP. In such an embodiment, the input sensing layer ISP may be manufactured through a process separate from that of the display panel DP and may then be fixed on an upper surface of the display panel DP by an adhesive film.

In an embodiment where the input sensing layer ISP is directly disposed on the display panel DP by a continuous process, the input sensing layer ISP may be directly disposed on the encapsulation substrate. In an alternative embodiment, where an adhesive film is disposed between the input sensing layer ISP and the display panel DP, the input sensing layer ISP may be fixed on the upper surface of the encapsulation substrate by the adhesive film.

Figure 4:
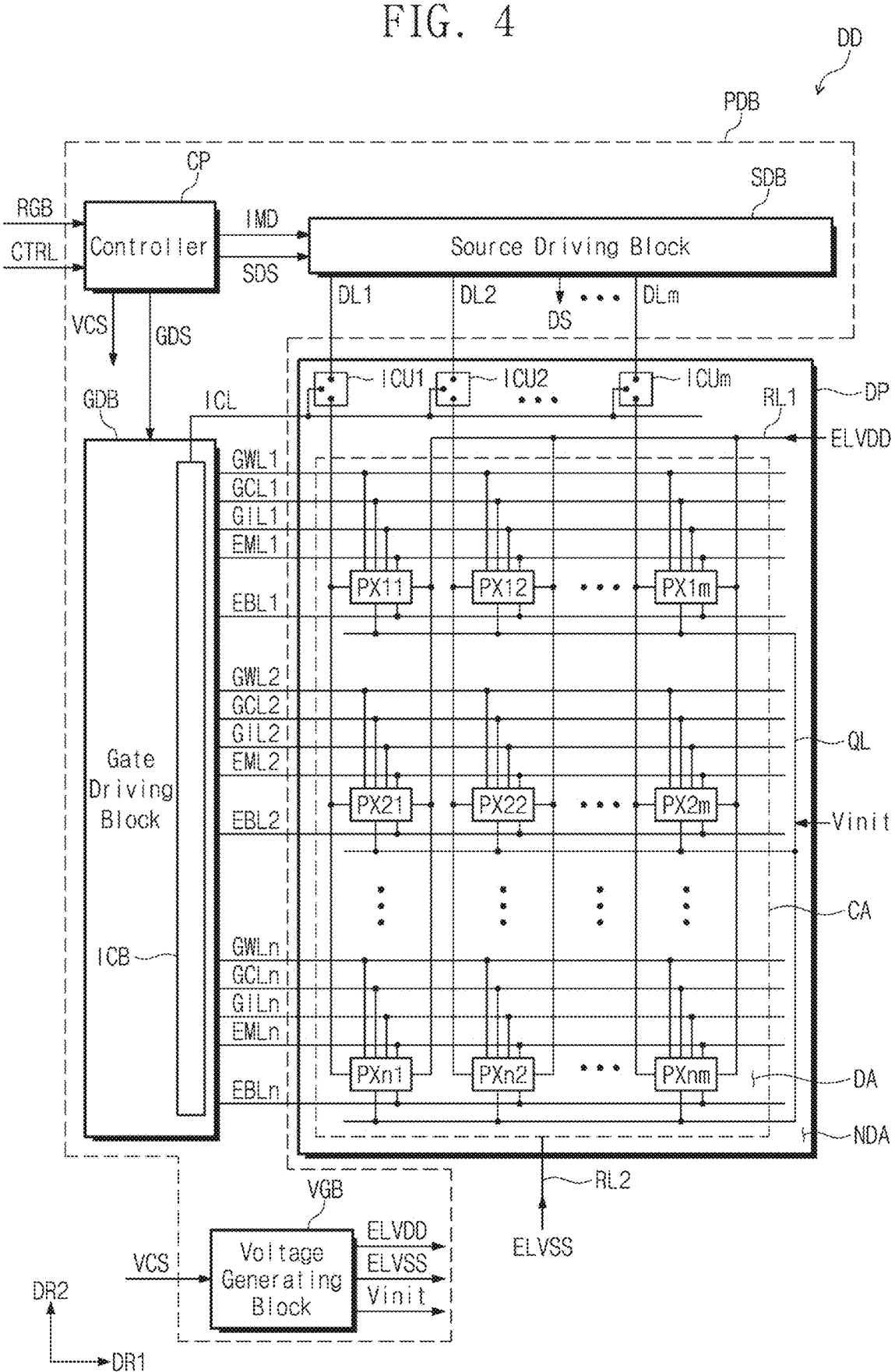
FIG. 4 is a block diagram of a display device according to an embodiment of the disclosure.

FIG. 4 is a block diagram of a display device according to an embodiment of the disclosure.

Referring to FIG. 4, an embodiment of the display device DD includes the display panel DP and a panel driving block PDB.

In an embodiment, the panel driving block PDB includes a controller CP, a source driving block SDB, a gate driving block GDB, and a voltage generating block VGB.

The controller CP receives an image signal RGB and an external control signal CTRL. The controller CP generates image data IMD by converting a data format of the image signal RGB in compliance with the specification for an interface with the source driving block SDB. The controller CP generates a source control signal SDS, a gate control signal GDS, and a voltage control signal VCS based on the image signal RGB and the external control signal CTRL. The external control signal CTRL may include a vertical synchronization signal, a horizontal synchronization signal, a main clock, etc.

The controller CP may provide the image data IMD and the source control signal SDS to the source driving block SDB. The source control signal SDS may include a horizontal start signal that indicates a start of an operation of the source driving block SDB. In response to the source control signal SDS, the source driving block SDB generates a data signal DS based on the image data IMD. The source driving block SDB outputs the data signal DS to a plurality of data lines DL1 to DLm to be described later. The data signal DS refers to an analog voltage corresponding to a gray scale value of the image data IMD.

The gate driving block GDB receives the gate control signal GDS from the controller CP. The gate control signal GDS may include a vertical start signal that indicates a start of an operation of the gate driving block GDB, a clock signal that determines output timing of signals, etc. The gate driving block GDB generates a plurality of scan signals, a plurality of compensation scan signals, and a plurality of initialization scan signals, based on the gate control signal GDS. The gate driving block GDB sequentially outputs the scan signals to a plurality of scan lines GWL1 to GWLn, sequentially outputs the compensation scan signals to a plurality of compensation lines GCL1 to GCLn, and sequentially outputs the initialization scan signals to a plurality of initialization lines GIL1 to GILn.

The gate driving block GDB generates a plurality of emission signals and a plurality of emission initialization signals, based on the gate control signal GDS. The gate driving block GDB sequentially output the emission signals to a plurality of emission lines EML1 to EMLn, and sequentially outputs the emission initialization signals to a plurality of emission initialization lines EBL1 to EBLn.

The voltage generating block VGB receives the voltage control signal VCS from the controller CP. The voltage generating block VGB generates voltages used for an operation of the display panel DP. In an embodiment, the voltage generating block VGB generates a first driving voltage ELVDD, a second driving voltage ELVSS, and an initialization voltage Vinit. The voltage generating block VGB may operate under control of the controller CP. In an embodiment, a voltage level of the first driving voltage ELVDD is greater than a voltage level of the second driving voltage ELVSS. In an embodiment, the voltage level of the first driving voltage ELVDD may be in a range of about 20 volts (V) to about 30 V. A voltage level of the initialization voltage Vinit is lower than the voltage level of the second driving voltage ELVSS. In an embodiment, the voltage level of the initialization voltage Vinit may be in a range of about 1 V to about 9 V.

In an embodiment, the display panel DP includes the plurality of scan lines GWL1 to GWLn, the plurality of compensation lines GCL1 to GCLn, the plurality of initialization lines GIL1 to GILn, the plurality of emission lines EML1 to EMLn, the plurality of emission initialization lines EBL1 to EBLn, the plurality of data lines DL1 to DLm, and the plurality of pixels PX11 to PXnm.

The scan lines GWL1 to GWLn, the compensation lines GCL1 to GCLn, the initialization lines GIL1 to GILn, the emission lines EML1 to EMLn, and the emission initialization lines EBL1 to EBLn extend in the first direction DR1, and are arranged to be spaced from each other in the second direction DR2. The data lines DL1 to DLm extend from the source driving block SDB in a direction facing away from the second direction DR2 and are arranged to be spaced from each other in the first direction DR1.

Each of the pixels PX11 to PXnm are connected with corresponding signal lines among the signal lines GWL1 to GWLn, GCL1 to GCLn, GIL1 to GILn, EML1 to EMLn, and EBL1 to EBLn. A connection relationship of the pixels PX11 to PXnm and the signal lines GWL1 to GWLn, GCL1 to GCLn, GIL1 to GILn, EML1 to EMLn, and EBL1 to EBLn may be changed based on a configuration of a driving circuit of the pixels PX11 to PXnm. In an embodiment, the pixels PX11 to PXnm may be disposed in the display area DA (refer to FIG. 2) of the display panel DP.

In an embodiment, the display panel DP includes a first power line RL1, a second power line RL2, and an initialization power line QL. Each of the pixels PX11 to PXnm is electrically connected with the first power line RL1, the second power line RL2, and the initialization power line QL. The first power line RL1 receives the first driving voltage ELVDD from the voltage generating block VGB. The second power line RL2 receives the second driving voltage ELVSS from the voltage generating block VGB. The initialization power line QL receives the initialization voltage Vinit from the voltage generating block VGB.

The pixels PX11 to PXnm may include a plurality of groups including organic light-emitting diodes that generate different color lights. In one embodiment, for example, the pixels PX11 to PXnm may include red pixels that generate a red color light, green pixels that generates a green color light, and blue pixels that generate a blue color light. A light-emitting diode of a red pixel, a light-emitting diode of a green pixel, and a light-emitting diode of a blue pixel may include emission layers of different materials, respectively. A light-emitting diode included in each of the pixels PX11 to PXnm may include a cathode CA (refer to FIG. 7). The cathode CA may be electrically connected with the second power line RL2 to receive the second driving voltage ELVSS from the voltage generating block VGB. Alternatively, the cathodes CA included in the pixels PX11 to PXnm may be integrally formed as a single unitary unit to form a common cathode. In an embodiment, the common cathode may be disposed to overlap two or more pixels.

In an embodiment, the display panel DP may further include a plurality of impedance control units ICU1 to ICUm electrically connected with the data lines DL1 to DLm, respectively. Each of the impedance control units ICU1 to ICUm is connected with an impedance control line ICL. In an embodiment, the impedance control units ICU1 to ICUm may be disposed between the source driving block SDB and the pixels PX11 to PXnm. In an embodiment, a corresponding impedance control unit among the impedance control units ICU1 to ICUm and corresponding pixels among the pixels PX11 to PXnm may be arranged in a direction facing away from the second direction DR2, to be connected with each of the data lines DL1 to DLm.

In an embodiment, the gate driving block GDB may include an impedance control block ICB. The impedance control block ICB may generate an impedance control signal ICS (refer to FIG. 7) based on scan signals generated by the gate driving block GDB. The impedance control block ICB outputs the impedance control signal ICS to the impedance control units ICU1 to ICUm through the impedance control line ICL. In an alternative embodiment, the impedance control block ICB may be disposed outside the gate driving block GDB. In an embodiment, the panel driving block PDB may include a separate impedance control block.

The impedance of each of the data lines DL1 to DLm may be adjusted by controlling the impedance control units ICU1 to ICUm in response to the impedance control signal ICS.

The impedance control units ICU1 to ICUm may be disposed between the source driving block SDB and the pixels PX11 to PXnm. The impedance control units ICU1 to ICUm may be disposed in the non-display area NDA.

In an embodiment, in the case where the source driving block SDB provides the data signal DS to the pixels PX11 to PXnm through the impedance control units ICU1 to ICUm, the impedance of each of the data lines DL1 to DLm may be controlled by the corresponding impedance control unit, and thus, the luminance of pixels connected with each of the data lines DL1 to DLm may be effectively prevented from being distorted by the external input TC (refer to FIG. 1). How the distortion of luminance of the pixels PX11 to PXnm is prevented by the impedance control units ICU1 to ICUm will be described later in detail with reference to FIGS. 7 to 13.

In an embodiment, a single impedance control unit is electrically connected with a single data line as illustrated in FIG. 4, but embodiments of the disclosure are not limited thereto. In an alternative embodiment, a plurality of impedance control units may be electrically connected with a single data line.

Figure 5:
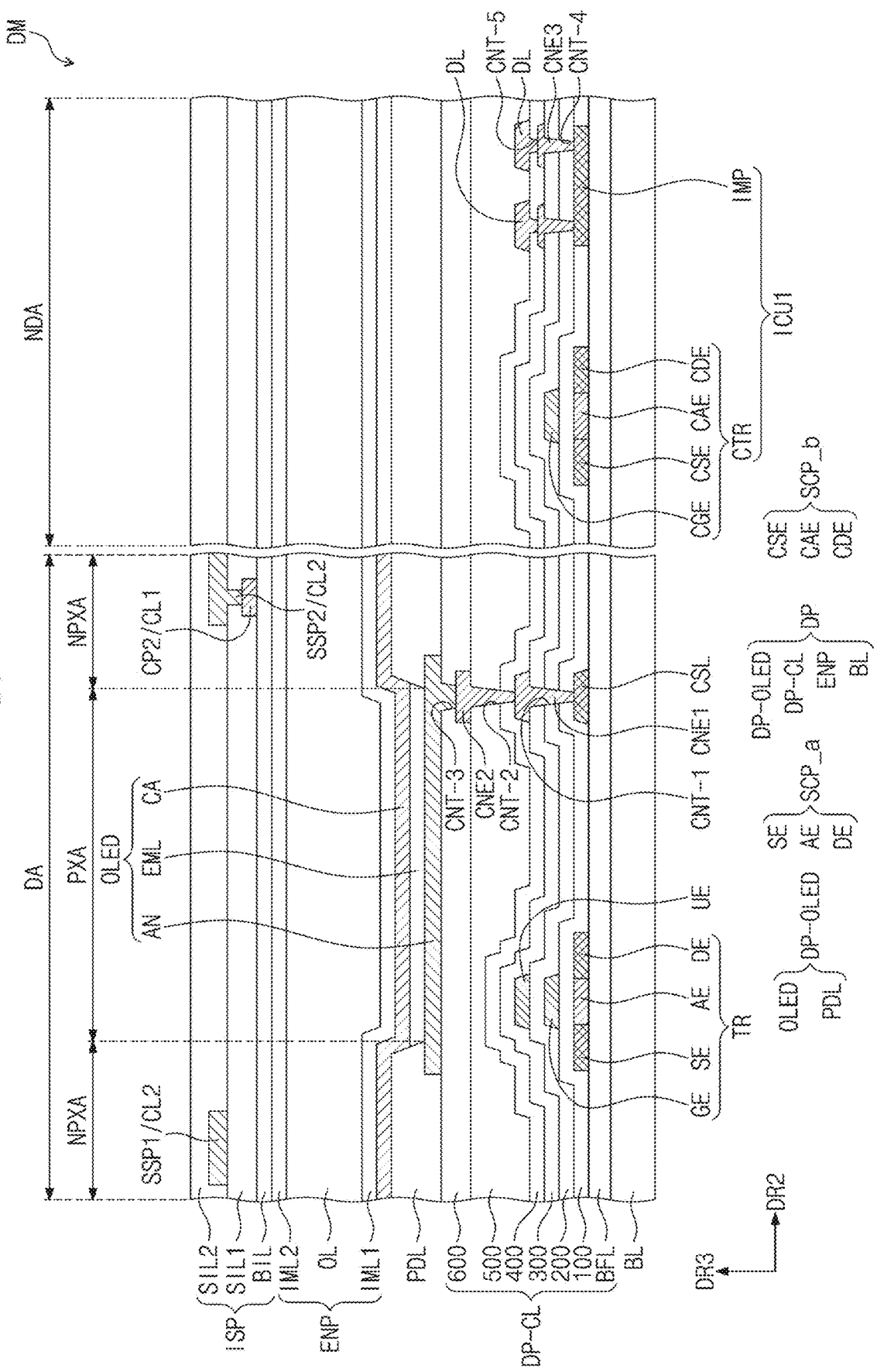
FIG. 5 is a cross-sectional view of a partial area of a display device according to an embodiment of the disclosure.

FIG. 5 is a cross-sectional view of a partial area of a display device according to an embodiment of the disclosure.

An embodiment of the display module DM includes the display panel DP and the input sensing layer ISP. The display panel DP includes the base layer BL, the circuit element layer DP-CL, the display element layer DP-OLED, and the encapsulation layer ENP.

In an embodiment, the base layer BL may include a synthetic resin layer. The synthetic resin layer may include a thermosetting resin. The base layer BL may have a multilayer structure. In one embodiment, for example, the base layer BL may have a three-layer structure of a synthetic resin layer, an adhesive layer, and a synthetic resin layer. In an embodiment, the synthetic resin layer may be a polyimide-based resin layer, but a material thereof is not particularly limited. The synthetic resin layer may include at least one selected from acrylic resin, methacrylic resin, polyisoprene, vinyl resin, epoxy resin, urethane resin, cellulose resin, siloxane resin, polyamide resin, and perylene resin. In an embodiment, the base layer BL may include a glass substrate, a metal substrate, or an organic/inorganic composite substrate.

At least one inorganic layer may be disposed on an upper surface of the base layer BL. The inorganic layer may include at least one selected from aluminum oxide, titanium oxide, silicon oxide, silicon oxynitride, zirconium oxide, and hafnium oxide. The inorganic layer may be formed in multiple layers for have a multilayer structure. The multiple inorganic layers may constitute a barrier layer and/or a buffer layer. In an embodiment, the circuit element layer DP-CL may include a buffer layer BFL, as shown in FIG. 5.

The circuit element layer DP-CL may include a plurality of intermediate insulating layers, a semiconductor pattern, a conductive pattern, a signal line, etc. In an embodiment, an intermediate insulating layer, a semiconductor layer, and a conductive layer may be formed in a coating or deposition manner. Afterwards, the intermediate insulating layer, the semiconductor layer, and the conductive layer may be selectively patterned in a photolithography manner. The semiconductor pattern, the conductive pattern, the signal line, etc. included in the circuit element layer DP-CL may be formed through the above processes.

The circuit element layer DP-CL may include the buffer layer BFL, a first intermediate insulating layer 100, a second intermediate insulating layer 200, a third intermediate insulating layer 300, a fourth intermediate insulating layer 400, a fifth intermediate insulating layer 500, and a sixth intermediate insulating layer 600.

The buffer layer BFL may improve a bonding force between the base layer BL and the semiconductor pattern. The buffer layer BFL may include a silicon oxide layer and a silicon nitride layer, and the silicon oxide layer and the silicon nitride layer may be alternately stacked one on another therein.

The semiconductor pattern may be disposed on the buffer layer BFL. The semiconductor pattern may include polysilicon. However, embodiments are not limited thereto, and alternatively, the semiconductor pattern may include amorphous silicon or metal oxide.

FIG. 5 shows only a portion of the semiconductor pattern, and the semiconductor pattern may be further disposed in any other area of a pixel in a plan view. The semiconductor pattern may be arranged across the pixels in a specific rule or pattern. An electrical property of the semiconductor pattern may vary depending on whether it is doped or not. The semiconductor pattern may include a first semiconductor region having high conductivity and a second semiconductor region having low conductivity. The first semiconductor region may be doped with an N-type dopant or a P-type dopant. A P-type transistor includes a doped region doped with a P-type dopant. The second semiconductor region may be an undoped region or may be doped at a lower concentration than that of the first semiconductor region.

The conductivity of the first semiconductor region is greater than that of the second semiconductor region, and substantially serves as an electrode or a signal line. The second semiconductor region substantially corresponds to a channel (or active) region of a transistor. Accordingly, a portion of the semiconductor pattern may be a channel region of a transistor, another portion thereof may be a source region or a drain region of the transistor, and another portion may be a connection electrode or a connection signal line.

In an embodiment, as illustrated in FIG. 5, a source region SE, a channel region AE, and a drain region DE of a transistor TR are formed from (or defined by parts of) a semiconductor pattern SCP_a. The source region SE and the drain region DE may extend in opposite directions from the channel region AE in a cross-sectional view. A portion of a connection signal line CSL may be formed from the semiconductor pattern SCP_a as illustrated in FIG. 5. Although not illustrated separately, the connection signal line CSL may be electrically connected with the drain region DE of the transistor TR in a plan view.

The first intermediate insulating layer 100 is disposed on the buffer layer BFL. The first intermediate insulating layer 100 overlaps a plurality of pixels in common and covers the semiconductor pattern SCP_a. The first intermediate insulating layer 100 may be an inorganic layer and/or an organic layer, and may have a single-layer or multilayer structure. The first intermediate insulating layer 100 may include at least one selected from aluminum oxide, titanium oxide, silicon oxide, silicon oxynitride, zirconium oxide, and hafnium oxide. In an embodiment, the first intermediate insulating layer 100 may be a single silicon oxide layer. In an embodiment to the first intermediate insulating layer 100, the intermediate insulating layers 200, 300, 400, 500, and 600 of the circuit element layer DP-CL to be described later may be inorganic and/or organic layers, and may have a single-layer or multilayer structure. The inorganic layer may include at least one selected from the above-described materials.

A gate GE of the transistor TR is disposed on the first intermediate insulating layer 100. The gate GE may be a part of the metal pattern. The gate GE may overlap the channel area AE. The gate GE may function as a mask in the process of doping the semiconductor pattern SCP_a.

The second intermediate insulating layer 200 covering the gate GE is disposed on the first intermediate insulating layer 100. The second intermediate insulating layer 200 may overlap pixels in common. The second intermediate insulating layer 200 may be an inorganic layer and/or an organic layer, and may have a single-layer or multilayer structure. In an embodiment, the second intermediate insulating layer 200 may be a single silicon oxide layer.

An upper electrode UE is disposed on the second intermediate insulating layer 200. The upper electrode UE may overlap the gate GE. The upper electrode UE may be a part of the metal pattern. A portion of the gate GE, and the upper electrode UE overlapping each other may define a capacitor. In an alternative embodiment of the invention, the upper electrode UE may be omitted.

The third intermediate insulating layer 300 covering the upper electrode UE is disposed on the second intermediate insulating layer 200. The third intermediate insulating layer 300 may overlap pixels in common. The third intermediate insulating layer 300 may include an organic material and/or an inorganic material, and may have a single-layer or multilayer structure. In an embodiment, the third intermediate insulating layer 300 may be a single silicon oxide layer.

A first connection electrode CNE1 may be disposed on the third intermediate insulating layer 300. The first connection electrode CNE1 may be connected with the connection signal line CSL through a first contact hole CNT-1 defined through the first to third intermediate insulating layers 100, 200, and 300.

The fourth intermediate insulating layer 400 may be disposed on the third intermediate insulating layer 300. The fourth intermediate insulating layer 400 may be a single silicon oxide layer.

The fifth intermediate insulating layer 500 is disposed on the fourth intermediate insulating layer 400. The fifth intermediate insulating layer 500 may be an organic layer. A second connection electrode CNE2 may be disposed on the fifth intermediate insulating layer 500. The second connection electrode CNE2 may be connected with the first connection electrode CNE1 through a second contact hole CNT-2 defined through the fourth and fifth intermediate insulating layers 400 and 500.

The sixth intermediate insulating layer 600 covering the second connection electrode CNE2 is disposed on the fifth intermediate insulating layer 500. The sixth intermediate insulating layer 600 may be an organic layer.

The display element layer DP-OLED may be disposed on the circuit element layer DP-CL. In an embodiment, the display element layer DP-OLED may include a light-emitting element OLED and a pixel defining layer PDL.

The light-emitting element OLED may include an anode AN disposed on the circuit element layer DP-CL, an emission layer EML disposed on the anode AN, and a cathode CA disposed on the emission layer EML.

The anode AN is disposed on the sixth intermediate insulating layer 600. The anode AN is connected to the second connection electrode CNE2 through a third contact hole CNT-3 defined through the sixth intermediate insulating layer 600.

The pixel defining layer PDL may be disposed on the sixth intermediate insulating layer 600 and may cover a portion of the anode AN. A pixel opening is defined in the pixel defining layer PDL. The pixel opening exposes at least a portion of the anode AN. In an embodiment, an emission area PXA may correspond to a portion of the anode AN, which is exposed by the pixel opening. A non-emission area NPXA may surround the emission area PXA.

The emission layer EML is disposed on the anode AN. The emission layer EML may be disposed on a region of the anode AN, which corresponds to the pixel opening. In an embodiment, the emission layer EML may be independently disposed for each pixel. The emission layer EML may include an emission material including a fluorescent material or a phosphorescent material. The emission material may include, but is not limited to, an organic emission material or an inorganic emission material.

The cathode CA is disposed on the emission layer EML. The cathode CA is provided in the form of a common electrode and is disposed in common in a plurality of pixels.

In an embodiment, the light-emitting element OLED may further include a hole control layer and an electron control layer. The hole control layer may be disposed between the anode AN and the emission layer EML and may further include a hole injection layer. The electron control layer may be disposed between the emission layer EML and the cathode CA and may further include an electron injection layer.

The encapsulation layer ENP may be disposed on the display element layer DP-OLED. The encapsulation layer ENP may be disposed on the cathode CA.

The encapsulation layer ENP is disposed in common in a plurality of pixels. In an embodiment, the encapsulation layer ENP may directly cover the cathode CA. In an embodiment of the invention, a capping layer covering the cathode CA may be further disposed between the encapsulation layer ENP and the cathode CA. In such an embodiment, the encapsulation layer ENP may directly cover the capping layer.

The encapsulation layer ENP may include a first inorganic layer IML1, an organic layer OL, and a second inorganic layer IML2. The first inorganic layer IML1 and the second inorganic layer IML2 protect the light-emitting element OLED from moisture and oxygen, and the organic layer OL protects the light-emitting element OLED from a foreign material such as a dust particle. The first inorganic layer IML1 and the second inorganic layer IML2 may include a silicon nitride layer, a silicon oxynitride layer, a silicon oxide layer, a titanium oxide layer, or an aluminum oxide layer. The organic layer OL may include, but is not limited to, an acryl-based organic layer.

The first inorganic layer IML1 may be disposed on the light-emitting element OLED. The organic layer OL is disposed on the first inorganic layer IML1. The second inorganic layer IML2 may be disposed on the organic layer OL.

The input sensing layer ISP may be disposed on the display panel DP. The input sensing layer ISP may include a base insulating layer BIL, a first conductive layer CL1, a first sensing insulating layer SIL1 a second conductive layer CL2, and a second sensing insulating layer SIL2. In an embodiment, the first and second sensing insulating layers SIL1 and SIL2 may be an inorganic layer and/or an organic layer and may have a single-layer or multilayer structure.

The base insulating layer BIL may be directly disposed on the encapsulation layer ENP. In one embodiment, for example, the base insulating layer BIL may be in direct contact with the second inorganic layer IML2. The base insulating layer BIL may have a single-layer or multilayer structure.

The first conductive layer CL1 may be disposed on the base insulating layer BIL. The first sensing insulating layer SIL1 may be disposed on the first conductive layer CL1. The first sensing insulating layer SIL1 may be an inorganic layer and/or an organic layer and may have a single-layer or multilayer structure.

The second conductive layer CL2 may be disposed on the first sensing insulating layer SIL1 Each of the first conductive layer CL1 and the second conductive layer CL2 may have a single-layer structure or may have a structure in which multiple layers are stacked along the third direction DR3. A conductive layer of a single-layer structure may include an electrode layer or a transparent conductive layer.

The first conductive layer CL1 and the second conductive layer CL2 may include first sensor parts SSP1, second sensor parts SSP2, first connection parts CP1 (refer to FIG. 6), second connection parts CP2, etc. In an embodiment, the first conductive layer CL1 may include the second connection parts CP2. The second conductive layer CL2 may include the first sensor parts SSP1, the second sensor parts SSP2, and the first connection parts CP1 (refer to FIG. 6). Alternatively, the first sensor parts SSP1, the second sensor parts SSP2, and the first connection parts CP1 may be included in the first conductive layer CL1, and the second connection parts CP2 may be included in the second conductive layer CL2.

The second sensing insulating layer SIL2 may be disposed on the second conductive layer CL2. The second sensing insulating layer SIL2 may be an inorganic layer and/or an organic layer and may have a single-layer or multilayer structure.

In an embodiment, the first and second sensor parts SSP1 and SSP2 and the first and second connection parts CP1 and CP2 may be disposed in the non-emission area NPXA.

In an embodiment, the impedance control unit ICU may be disposed in the non-display area NDA. The impedance control unit ICU may include a control transistor CTR and an impedance part IMP. A source region CSE, a channel region CAE, and a drain region CDE of the control transistor CTR are formed from (or defined by parts of) a semiconductor pattern SCP_b. The source region CSE and the drain region CDE of the control transistor CTR may extend in opposite directions from the channel region CAE in a cross-sectional view. A gate CGE of the control transistor CTR is disposed on the first intermediate insulating layer 100. The gate CGE of the control transistor CTR may be a part of the metal pattern. The gate CGE may overlap the channel region CAE. The gate CGE may function as a mask in the process of doping the semiconductor pattern SCP_b. The control transistor CTR may be disposed in a same layer as the transistor TR (hereinafter referred to as a "pixel transistor") disposed in the display area DA.

In an embodiment, the impedance part IMP may include a resistor or a capacitor. In one embodiment, for example, the impedance part IMP includes a resistor as illustrated in FIG. 5. In an embodiment, the impedance part IMP may be disposed in the circuit element layer DP-CL. The impedance part IMP may be disposed in a same layer as the semiconductor pattern SCP_b of the control transistor CTR or the semiconductor pattern SCP_a of the pixel transistor TR. In an embodiment, the impedance part IMP may be formed in a process of forming the semiconductor pattern SCP_a of the pixel transistor TR or the semiconductor pattern SCP_b of the control transistor CTR. In an embodiment, the impedance part IMP may include polysilicon or metal oxide. Alternatively, the impedance part IMP may include metal. A resistance of the impedance part IMP when the impedance part IMP includes polysilicon or metal oxide may be greater than a resistance of the impedance part IMP when the impedance part IMP includes metal.

A third connection electrode CNE3 may be disposed on the third intermediate insulating layer 300. The third connection electrode CNE3 may be connected with the impedance part IMP through a fourth contact hole CNT-4 defined through the first to third intermediate insulating layers 100, 200, and 300.

The fourth intermediate insulating layer 400 may be disposed on the third intermediate insulating layer 300. A data line DL may be disposed on the fourth intermediate insulating layer 400. The data line DL may be connected with the third connection electrode CNE3 through a fifth contact hole CNT-5 defined through the fourth intermediate insulating layer 400.

A portion of the semiconductor pattern SCP_b of the control transistor CTR is illustrated in FIG. 5. Although not illustrated separately, the semiconductor pattern SCP_b of the control transistor CTR may be electrically connected with the data line DL through a contact hole defined through the first to fourth intermediate insulating layers 100, 200, 300, and 400.

Figure 6:
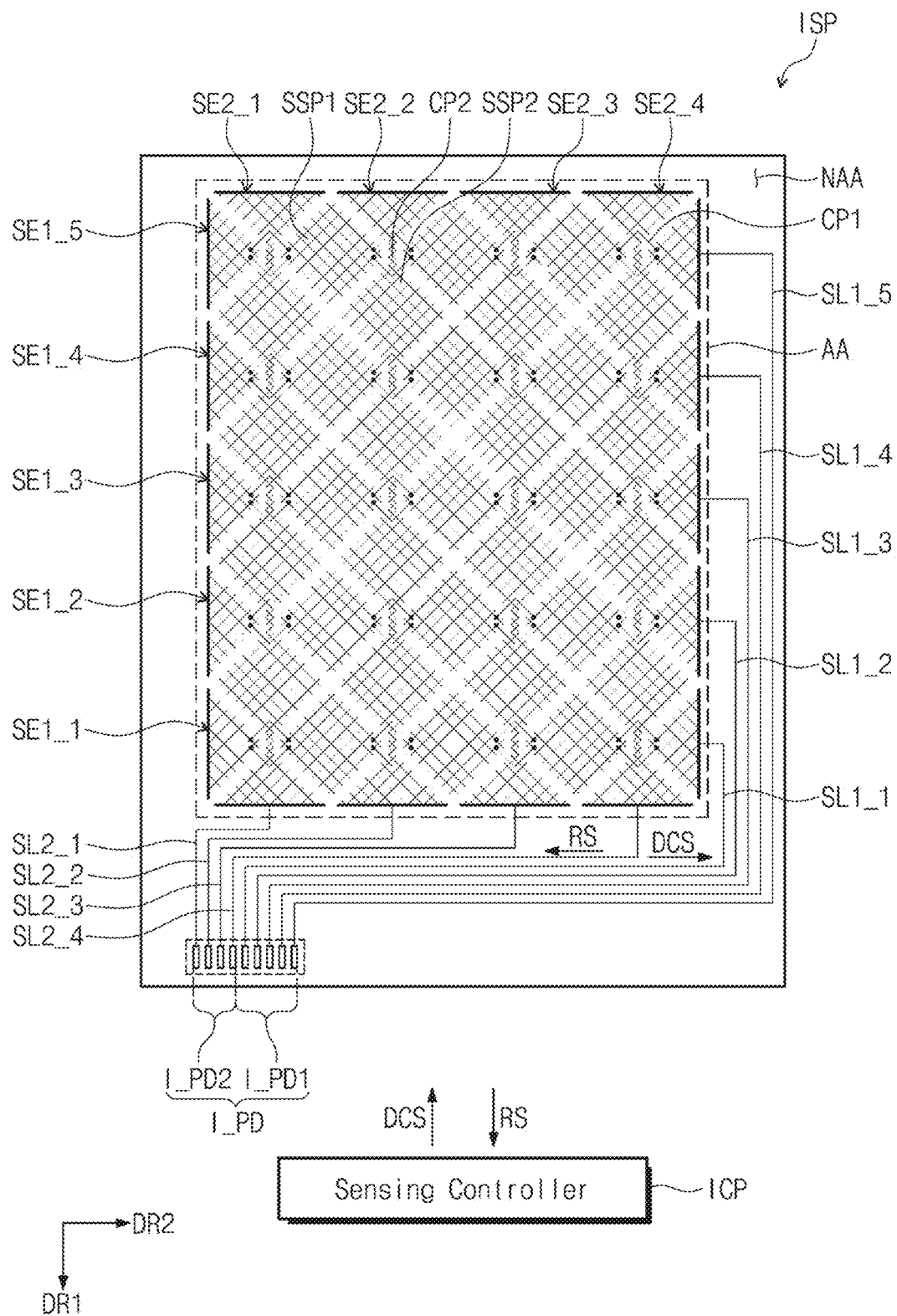
FIG. 6 is a plan view of an input sensing layer according to an embodiment of the disclosure.

FIG. 6 is a plan view of an input sensing layer according to an embodiment of the disclosure.

Referring to FIG. 6, an embodiment of the input sensing layer ISP includes an active area AA and an inactive area NAA adjacent to the active area AA. In an embodiment, the active area AA may correspond to at least a portion of the display area DA (refer to FIG. 2) of the display panel DP (refer to FIG. 2).

A plurality of sensing electrodes SE1_1 to SE1_5 and SE2_1 to SE2_4 may be disposed in the active area AA, and a plurality of signal lines SL1_1 to SL1_5 and SL2_1 to SL2_4 may be disposed in the inactive area NAA.

In an embodiment, the sensing electrodes SE1_1 to SE1_5 and SE2_1 to SE2_4 include transmit electrodes SE1_1 to SE1_5 and receive electrodes SE2_1 to SE2_4.

The signal lines SL1_1 to SL1_5 and SL2_1 to SL2_4 may include transmit signal lines SL1_1 to SL1_5 connected with the transmit electrodes SE1_1 to SE1_5 and receive signal lines SL2_1 to SL2_4 connected with the receive electrodes SE2_1 to SE2_4.

The transmit electrodes SE1_1 to SE1_5 and the receive electrodes SE2_1 to SE2_4 cross each other. The transmit electrodes SE1_1 to SE1_5 are arranged in the first direction DR1 and extend in the second direction DR2. The receive electrodes SE2_1 to SE2_4 are arranged in the second direction DR2 and extend in the first direction DR1.

In an embodiment, the input sensing layer ISP described above may obtain coordinate information in a mutual-cap mode. A capacitance is formed between the transmit electrodes SE1_1 to SE1_5 and the receive electrodes SE2_1 to SE2_4. The capacitance between the transmit electrodes SE1_1 to SE1_5 and the receive electrodes SE2_1 to SE2_4 may be changed by the external input TC (refer to FIG. 1), e.g., a touch thereon by a body of the user US (refer to FIG. 1). Here, sensing sensitivity of the input sensing layer ISP may be determined based on a variation of the capacitance.

Each of the transmit electrodes SE1_1 to SE1_5 includes the first sensor parts SSP1 and the first connection parts CP1 disposed in the active area AA. Each of the receive electrodes SE2_1 to SE2_4 includes the second sensor parts SSP2 and the second connection parts CP2 disposed in the active area AA.

The first sensor parts SSP1 are arranged along the second direction DR2 in one transmit electrode, and the second sensor parts SSP2 are arranged along the first direction DR1 in one receive electrode. Each of the first connection parts CP1 connects the first sensor parts SSP1 adjacent thereto, and each of the second connection parts CP2 connects the second sensor parts SSP2 adjacent thereto.

Each of the transmit electrodes SE1_1 to SE1_5 and the receive electrodes SE2_1 to SE2_4 may have a mesh shape. In an embodiment where each of the transmit electrodes SE1_1 to SE1_5 and the receive electrodes SE2_1 to SE2_4 has a mesh shape, a parasitic capacitance with electrodes included in the display panel DP (refer to FIG. 2) may decrease.

The mesh-shaped transmit electrodes SE1_1 to SE1_5 and the mesh-shaped receive electrodes SE2_1 to SE2_4 may include, but is not limited to, at least one selected from silver, aluminum, copper, chromium, nickel, titanium, etc.

The transmit signal lines SL1_1 to SL1_5 and the receive signal lines SL2_1 to SL2_4 may be disposed in the inactive area NAA.

The input sensing layer ISP may include input pads I_PD that extend from one ends transmit signal lines SL1_1 to SL1_5 and the receive signal lines SL2_1 to SL2_4 and are disposed in the inactive area NAA. The input pads I_PD may be electrically connected with the transmit signal lines SL1_1 to SL1_5 and the receive signal lines SL2_1 to SL2_4. In an embodiment, the input pads I_PD may include a transmit input pad I_PD1 with which the transmit signal lines SL1_1 to SL1_5 are electrically connected and a receive input pad I_PD2 with which the receive signal lines SL2_1 to SL2_4 are electrically connected.

The display device DD may further include a sensing controller ICP that controls the driving of the input sensing layer ISP.

In an embodiment, the sensing controller ICP may be electrically connected with the input sensing layer ISP. The sensing controller ICP may be electrically connected with the transmit signal lines SL1_1 to SL1_5 and the receive signal lines SL2_1 to SL2_4 through the input pads I_PD.

The sensing controller ICP transmits a driving control signal DCS to the transmit electrodes SE1_1 to SE1_5, and receives sensing signals RS, to which a variation of a capacitance between the transmit electrodes and the receive electrodes is applied, from the receive electrodes SE2_1 to SE2_4. In an embodiment, the driving control signal DCS may be a sensing scan signal that is sequentially transmitted to each of the transmit electrodes SE1_1 to SE1_5.

Referring to FIGS. 4 to 6, the first sensor parts SSP1 and the second sensor parts SSP2 may overlap the cathode CA. Parasitic capacitors may occur between the first sensor parts SSP1 and the cathode CA and between the second sensor parts SSP2 and the cathode CA. Accordingly, when the external input TC of the user US is sensed through the input sensing layer ISP, a noise voltage may be induced at the cathode CA by the driving control signal DCS or the sensing signals RS.

The data lines DL1 to DLm and the first power line RL1 may overlap the cathode CA. Parasitic capacitors may occur between each of the data lines DL1 to DLm and the cathode CA and between the first power line RL1 and the cathode CA. Accordingly, a noise voltage may be induced at the data lines DL1 to DLm and the first power line RL1 due to a noise component induced at the cathode CA by the external input TC. The occurrence of luminance distortion of the pixels PX11 to PXnm due to the noise voltages induced at the data lines DL1 to DLm and the first power line RL1 and a configuration and operation of the impedance control units ICU1 to ICUm for preventing the occurrence of luminance distortion will be described with reference to FIGS. 7 to 13.

Figure 7:
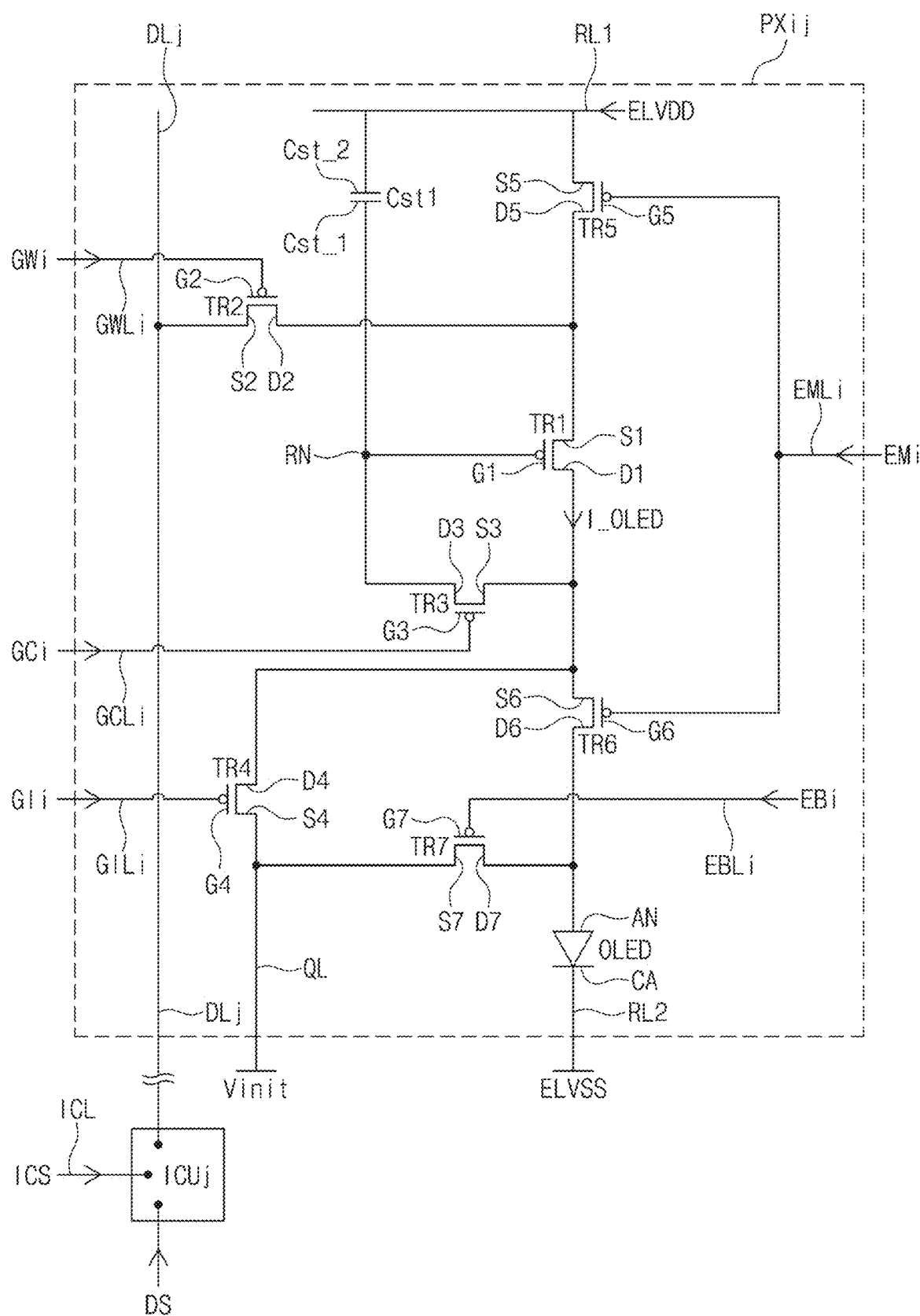
FIG. 7 is a circuit diagram of a pixel according to an embodiment of the disclosure.
Figure 8:
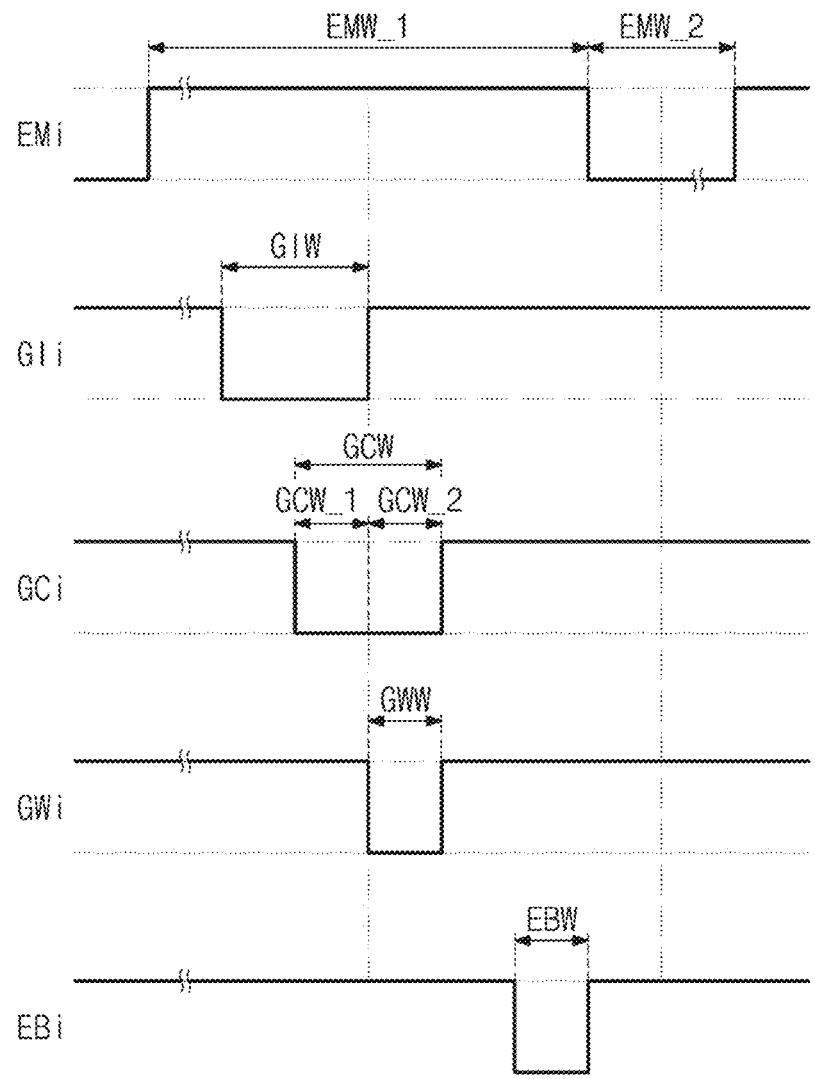
FIG. 8 is a signal timing diagram of driving signals for driving a pixel illustrated in FIG. 7.
Figure 9:
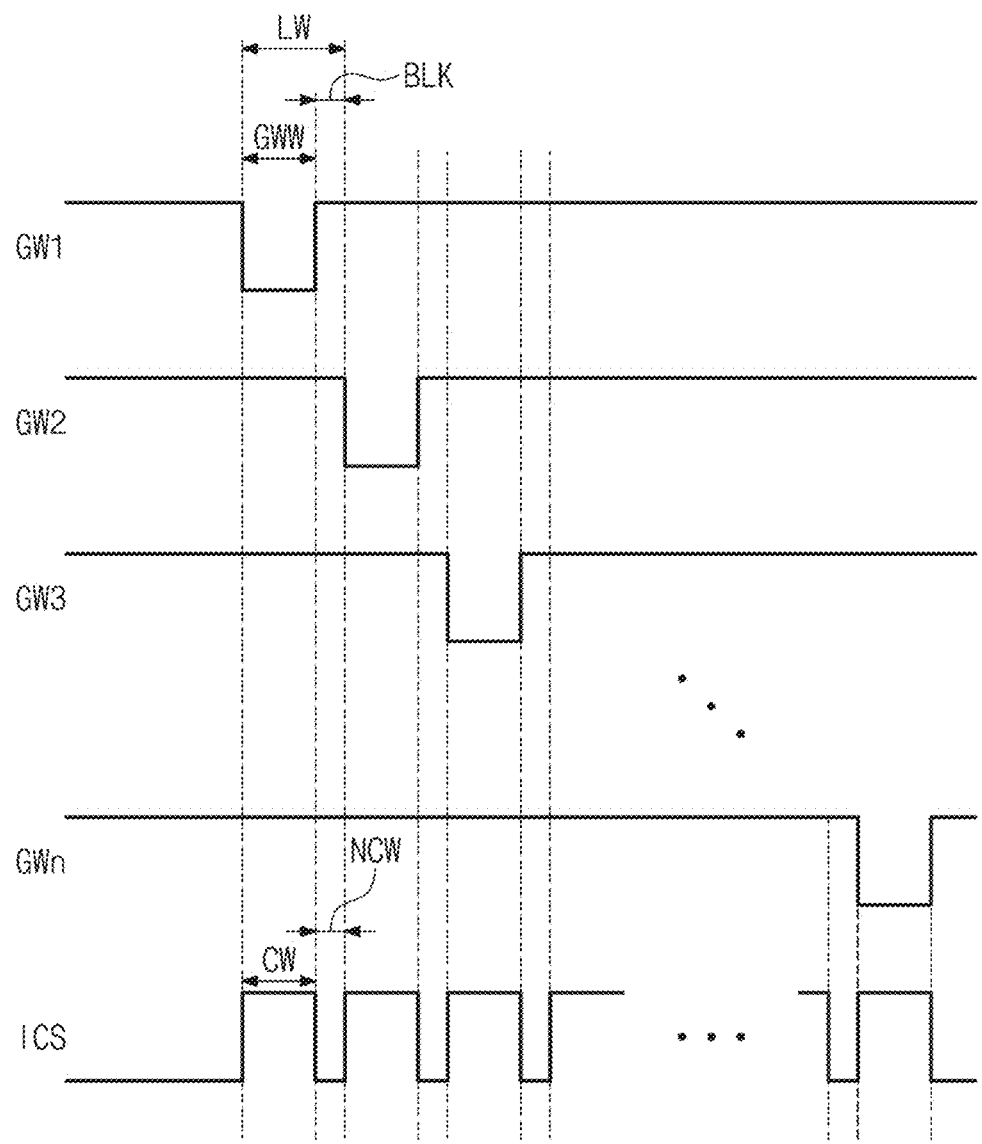
FIG. 9 is a signal timing diagram of driving signals for describing an operation of an impedance control block according to an embodiment of the disclosure.

FIG. 7 is a circuit diagram of a pixel according to an embodiment of the disclosure, and FIG. 8 is a signal timing diagram of driving signals for driving a pixel illustrated in FIG. 7. FIG. 9 is a signal timing diagram of driving signals for describing an operation of an impedance control block according to an embodiment of the disclosure.

Referring to FIG. 7, an embodiment of a pixel PXij that is connected with an i-th scan line GWLi among the scan lines GWL1 to GWLn and is connected with a j-th data line DLj among the data lines DL1 to DLm is illustrated for convenience of illustration and description.

In an embodiment, the pixel PXij may include first to seventh transistors TR1 to TR7 and a pixel capacitor Cst. In such an embodiment, each of the first to seventh transistors TR1 to TR7 may be a P-type transistor. However, embodiments of the disclosure are not limited thereto. In one alternative embodiment, for example, each of the first to seventh transistors TR1 to TR7 may be implemented with one of a P-type transistor or an N-type transistor. In one alternative embodiment, for example, at least one of the first to seventh transistors TR1 to TR7 may be implemented with a P-type transistor, and the other(s) thereof may be implemented with an N-type transistor. In such embodiments, the number of transistors included in the pixel PXij is not limited to those shown in FIG. 7. Alternatively, at least one of the first to seventh transistors TR1 to TR7 may be omitted. In another alternative embodiment, the pixel PXij may further include one or more additional transistors.

In an embodiment, the first transistor TR1 may be a driving transistor, and the second transistor TR2 may be a switching transistor. The pixel capacitor Cst is connected between the first power line RL1 of receiving the first driving voltage ELVDD and a reference node RN. The pixel capacitor Cst includes a first electrode Cst_1 connected with the reference node RN and a second electrode Cst_2 connected with the first power line RL1. In an embodiment, each of the first to seventh transistors TR1 to TR7 includes a first electrode, a second electrode, and a control electrode. Herein, the first electrode is referred to as a "source", the second electrode is referred to as a "drain", and the control electrode is referred to as a "gate".

The first transistor TR1 is connected between the first power line RL1 and the light-emitting element OLED. A source S1 of the first transistor TR1 is connected between the first power line RL1. In the specification, "that a transistor is connected with a signal line" may mean "that one of a source, drain, and a gate of the transistor is integrally formed with the signal line or is connected with the signal line through a connection electrode". Also, "that a first transistor is electrically connected with a second transistor" may mean "that one of a source, drain, and a gate of the first transistor is integrally formed with one of a source, a drain, and a gate of the second transistor or is connected therewith through a connection electrode".

Any other transistor may be disposed between the source S1 of the first transistor TR1 and the first power line RL1, or any other transistor therebetween may be omitted.

A drain D1 of the first transistor TR1 is electrically connected with the anode AN of the light-emitting element OLED. Any other transistor may be disposed between the drain D1 of the first transistor TR1 and the anode AN of the light-emitting element OLED, or any other transistor therebetween may be omitted. A gate G1 of the first transistor TR1 is electrically connected with the reference node RN.

The second transistor TR2 is connected between the j-th data line DLj and the source S1 of the first transistor TR1. The second transistor TR2 may include a first electrode, a second electrode, and a control electrode, the first electrode may be a source S2, the second electrode may be a drain D2, and the control electrode may be a gate G2. The source S2 of the second transistor TR2 is electrically connected with the j-th data line DLj, and the drain D2 of the second transistor TR2 is electrically connected with the source S1 of the first transistor TR1. In an embodiment, the gate G2 of the second transistor TR2 may be electrically connected with the i-th scan line GWLi.

The third transistor TR3 is connected between the reference node RN and the drain D1 of the first transistor TR1. The third transistor TR3 may include a first electrode, a second electrode, and a control electrode, the first electrode may be a source S3, the second electrode may be a drain D3, and the control electrode may be a gate G3. The source S3 of the third transistor TR3 is electrically connected with the drain D1 of the first transistor TR1, and the drain D3 of the third transistor TR3 is electrically connected with the reference node RN. In an embodiment, the gate G3 of the third transistor TR3 may be electrically connected with an i-th compensation line GCLi.

The fourth transistor TR4 is connected between the drain D1 of the first transistor TR1 and the initialization power line QL. The fourth transistor TR4 may include a first electrode, a second electrode, and a control electrode, the first electrode may be a source S4, the second electrode may be a drain D4, and the control electrode may be a gate G4. The source S4 of the fourth transistor TR4 is electrically connected with the initialization power line QL, and the drain D4 of the fourth transistor TR4 is electrically connected with the drain D1 of the first transistor TR1. In an embodiment, the gate G4 of the fourth transistor TR4 may be electrically connected with an i-th initialization line GILL In an embodiment, each of the third transistor TR3 and the fourth transistor TR4 may include a plurality of gates. As each of the third transistor TR3 and the fourth transistor TR4 has a plurality of gates, a leakage current of the pixel PXij may decrease.

The fifth transistor TR5 is connected between the first power line RL1 and the source S1 of the first transistor TR1. The fifth transistor TR5 may include a first electrode, a second electrode, and a control electrode, the first electrode may be a source S5, the second electrode may be a drain D5, and the control electrode may be a gate G5. The source S5 of the fifth transistor TR5 is electrically connected with the first power line RL1, and the drain D5 of the fifth transistor TR5 is electrically connected with the source S1 of the first transistor TR1. In an embodiment, the gate G5 of the fifth transistor TR5 may be electrically connected with an i-th emission line EMLi.

The sixth transistor TR6 is connected between the drain D1 of the first transistor TR1 and the light-emitting element OLED. The sixth transistor TR6 may include a first electrode, a second electrode, and a control electrode, the first electrode may be a source S6, the second electrode may be a drain D6, and the control electrode may be a gate G6. The source S6 of the sixth transistor TR6 is electrically connected with the drain D1 of the first transistor TR1, and the drain D6 of the sixth transistor TR6 is electrically connected with the anode AN of the light-emitting element OLED. In an embodiment, the gate G6 of the sixth transistor TR6 may be electrically connected with the i-th emission line EMLi.

The seventh transistor TR7 is connected between the anode AN of the light-emitting element OLED and the initialization power line QL. The seventh transistor TR7 may include a first electrode, a second electrode, and a control electrode, the first electrode may be a source S7, the second electrode may be a drain D7, and the control electrode may be a gate G7. The source S7 of the seventh transistor TR7 is electrically connected with the initialization power line QL, and the drain D7 of the seventh transistor TR7 is electrically connected with the anode AN of the light-emitting element OLED. In an embodiment, the gate G7 of the seventh transistor TR7 may be electrically connected with an i-th emission initialization line EBLi. The seventh transistor TR7 may receive an i-th emission initialization signal EBi.

A j-th impedance control unit ICUj may be electrically connected with the j-th data line DLj. The j-th impedance control unit ICUj is connected between the source driving block SDB (refer to FIG. 4) and the pixel PXij.

The j-th impedance control unit ICUj may receive the impedance control signal ICS through the impedance control line ICL.

A portion of one frame period is illustrated in FIG. 8. Referring to FIGS. 4 and 8, the display device DD displays the image IM every frame period. Each of the scan lines GWL1 to GWLn, the compensation lines GCL1 to GCLn, the initialization lines GIL1 to GILn, the emission lines EML1 to EMLn, and the emission initialization lines EBL1 to EBLn is sequentially scanned during one frame period.

Referring to FIG. 8, each of the i-th signals Gli, GCi, GWi, and EBi and the i-th emission signal EMi may have a high level during a partial period and may have a low level during a partial period. In this case, an N-type transistor is turned on when the corresponding signal has the high level, and a P-type transistor is turned on when the corresponding signal has the low level. In an embodiment of the disclosure, as described above, each of the first to seventh transistors TR1 to TR7 included in the pixel PXij is a P-type transistor. A high-level period of the i-th emission signal EMi is defined as a non-emission period EMW_1, and a low-level period of the i-th emission signal EMi is defined as an emission period EMW_2.

In the non-emission period EMW_1 of one frame, the i-th initialization scan signal Gli is supplied to the i-th initialization line GILL A low-level period of the i-th initialization scan signal Gli is defined as an initialization period GIW. When the fourth transistor TR4 is turned on in the initialization period GIW, the initialization voltage Vinit is transferred to the drain D1 of the first transistor TR1 through the fourth transistor TR4.

Next, an i-th compensation scan signal GCi is supplied to the i-th compensation line GCLi. A low-level period of the i-th compensation scan signal GCi is defined as a compensation period GCW. The compensation period GCW include a first period GCW_1 overlapping the initialization period GIW and a second period GCW_2 not overlapping the initialization period GIW. When the third transistor TR3 is turned on in the first period GCW_1, the initialization voltage Vinit is transferred to the gate G1 of the first transistor TR1 through the third transistor TR3 thus turned on. Accordingly, the reference node RN connected with the gate G1 of the first transistor TR1 is initialized to the initialization voltage Vinit. Afterwards, in the second period GCW_2, the third transistor TR3 maintains a turn-on state, and the fourth transistor TR4 is turned off.

Then, an i-th scan signal GWi is supplied to the i-th scan signal line GWLi. A low-level period of the i-th scan signal GWi is defined as a scan period GWW. When the second transistor TR2 is turned on in the scan period GWW, a data voltage (Vdata) corresponding to the data signal DS is transferred to the source S1 of the first transistor TR1 through the second transistor TR2. In this case, the second period GCW_2 described above overlaps the scan period GWW. The first transistor TR1 is diode-connected by the third transistor TR3 turned on in the second period GCW_2 and is forward biased. As such, a compensation voltage (Vdata−Vth) that corresponds to a result of subtracting a threshold voltage (Vth) of the first transistor TR1 from the data voltage (Vdata) applied to the source S1 of the first transistor TR1 is applied to the gate G1 of the first transistor TR1. Accordingly, a voltage of the reference node RN connected with the gate G1 of the first transistor TR1 may be the compensation voltage (Vdata−Vth). In this case, the first driving voltage ELVDD and the compensation voltage (Vdata−Vth) are respectively applied to opposite ends of the capacitor Cst, and charges corresponding to a voltage difference (ELVDD−(Vdata−Vth)) of the opposite ends may be stored in the pixel capacitor Cst. Accordingly, the first transistor TR1 is turned on, and the turn-on state of the first transistor TR1 is maintained by the charges stored in the pixel capacitor Cst.

Then, the i-th emission initialization signal EBi is supplied to the i-th emission initialization line EBLi. A low-level period of the i-th emission initialization signal EBi is defined as an emission initialization period EBW. When the seventh transistor TR7 is turned on in the emission initialization period EBW, the initialization voltage Vinit is transferred to the anode AN of the light-emitting element OLED through the seventh transistor TR7. As the initialization voltage Vinit is applied to the anode AN of the light-emitting element OLED, the light-emitting element OLED may be prevented from instantaneously emitting a light at high luminance due to a voltage remaining at the anode AN of the light-emitting element OLED at the beginning of driving the light-emitting element OLED.

Afterwards, an i-th emission signal EMi that turns on a transistor whose gate is electrically connected with the i-th emission line EMLi is applied to the i-th emission line EMLi during a predetermined period, which is referred to as the "emission period EMW_2". During the emission period EMW_2, the fifth transistor TR5 and the sixth transistor TR6 are turned on. According to the above bias condition, a driving current I_OLED may be generated based on a voltage difference between a gate voltage of the gate G1 of the first transistor TR1 and a source voltage of the source S1 of the first transistor TR1, and the driving current I_OLED is supplied to the light-emitting element OLED through the fifth and sixth transistors TR5 and TR6. That is, a current flows to the light-emitting element OLED. According to a current-voltage relationship of the first transistor TR1, the driving current I_OLED may be proportional to $(ELVDD-Vdata)^2$ being the square of a value obtained by subtracting the threshold voltage Vth of the first transistor TR1 from a gate-source voltage (Vgs) of the first transistor TR1. As such, the driving current I_OLED may be determined regardless of the threshold voltage (Vth) of the first transistor TR1.

In an embodiment, a magnitude of the driving current I_OLED flowing to the light-emitting element OLED may change due to a noise component induced at the j-th data line DLj and the first power line RL1 by the external input TC. In such an embodiment, an impedance of the j-th data line DLj and an impedance of the first power line RL1 may be different from each other. The impedance of the j-th data line DLj may be smaller than the impedance of the first power line RL1 since a size of a parasitic capacitor occurring between the j-th data line DLj and the cathode CA of the light-emitting element OLED may be smaller than a size of a parasitic capacitor occurring between the first power line RL1 and the cathode CA of the light-emitting element OLED.

The gate voltage of the first transistor TR1, which determines the magnitude of the driving current I_OLED flowing to the light-emitting element OLED is determined by the data voltage (Vdata) and the first driving voltage ELVDD applied to the opposite ends of the pixel capacitor Cst. In this case, when a magnitude of the impedance of the j-th data line DLj and a magnitude of the impedance of the first power line RL1 are different from each other, a first variation (V1) in the data voltage Vdata of the j-th data line DLj and a second variation (V2) in the first driving voltage ELVDD, which are due to the noise component induced by the external input TC, may be different from each other. In an embodiment, when the magnitude of the impedance of the j-th data line DLj is smaller than the magnitude of the impedance of the first power line RL1, the first variation (V1) may be smaller than the second variation (V2). Accordingly, charges corresponding to (ELVDD−(Vdata−Vth)+V3) to which a difference value (V3) of the first variation (V1) and the second variation (V2) are applied may be stored in the pixel capacitor Cst. In this case, a magnitude of the driving current I_OLED flowing to the light-emitting element OLED may change compared to the case where there is no noise component induced by the external input TC. Accordingly, the distortion of luminance of the light-emitting element OLED may occur. In an embodiment, the j-th data line DLj may be connected with the j-th impedance control unit ICUj to prevent the above distortion of luminance of the light-emitting element OLED from occurring.

Referring to FIG. 9, the scan signals GW1 to GWn are sequentially scanned to the scan lines GWL1 to GWLn (refer to FIG. 4).

A period in which one scan signal is scanned to one scan line may be defined as a line period LW. The line period LW includes the scan period GWW and a blank period BLK. In an embodiment, the first scan signal GW1 of the low level is transmitted to the first scan line GWL1 (refer to FIG. 4) during the scan period GWW, and the first scan signal GW1 of the high level is transmitted to the first scan line GWL1 in the blank period BLK. Then, the second scan signal GW2 of the low level is transmitted to the second scan line GWL2 (refer to FIG. 4) during the scan period GWW of a next line period LW, and the second scan signal GW2 of the high level is transmitted to the second scan line GWL2 in the blank period BLK of the next line period LW.

The impedance control signal ICS may have the high level during a partial period and may have the low level in a partial period. Hereinafter, an operation of the impedance control signal ICS will be described with reference to an embodiment where each of the impedance control units ICU1 to ICUm (refer to FIG. 4) to be controlled by the impedance control signal ICS includes a P-type control transistor CTR (refer to FIG. 5).

In an embodiment where each of the impedance control units ICU1 to ICUm includes the P-type control transistor CTR, a high-level period of the impedance control signal ICS is defined as a control period CW, and a low-level period of the impedance control signal ICS is defined as a non-control period NCW. In an alternative embodiment where each of the impedance control units ICU1 to ICUm includes an N-type control transistor CTR, the high-level period of the impedance control signal ICS is defined as the non-control period NCW, and the low-level period of the impedance control signal ICS is defined as the control period CW.

In an embodiment, the control period CW of the impedance control signal ICS may overlap the scan periods GWW of the scan signals GW1 to GWn. The scan periods GWW of the scan signals GW1 to GWn may be included in (or overlap) the control period CW of the impedance control signal ICS. In an embodiment, a width of the control period CW may be greater than or equal to a width of each of the scan periods GWW. In an embodiment, the width of the control period CW may be smaller than a width of the line period LW. In an embodiment, a sum of the width of the control period CW and a width of the non-control period NCW may be equal to the width of the line period LW.

A structure of the impedance control units ICU1 to ICUm and an operation of the impedance control units ICU1 to ICUm responding to the impedance control signal ICS will hereinafter be described with reference to FIGS. 10A to 13.

Figure 10A:
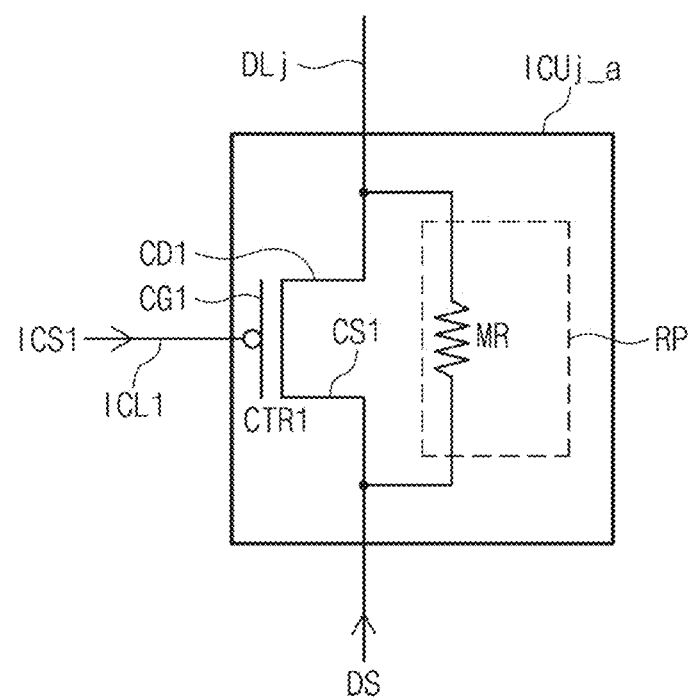
FIGS. 10A to 10C are circuit diagrams showing a structure of an impedance control unit including a resistor part.
Figure 10B:
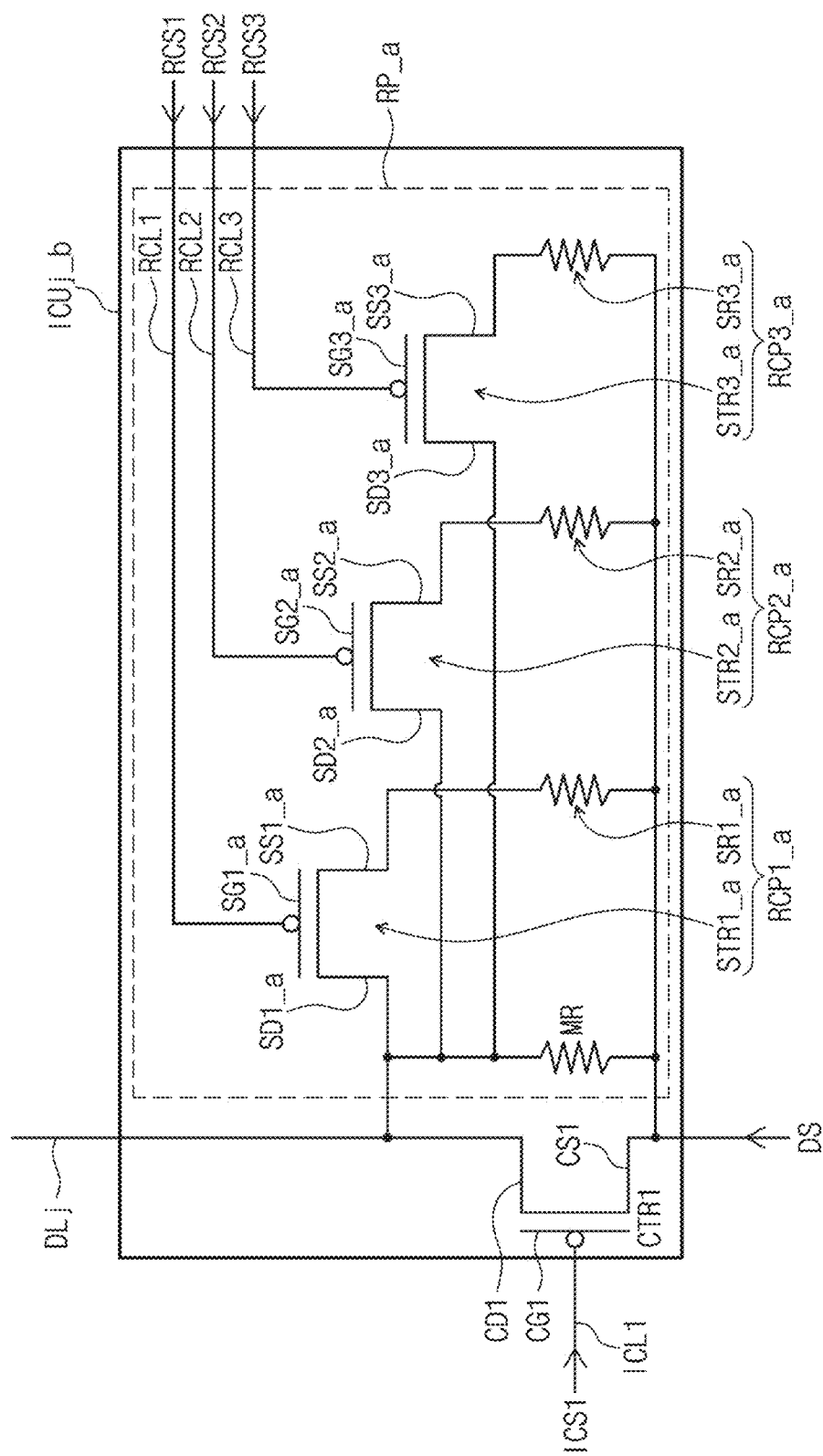
Figure 10C:
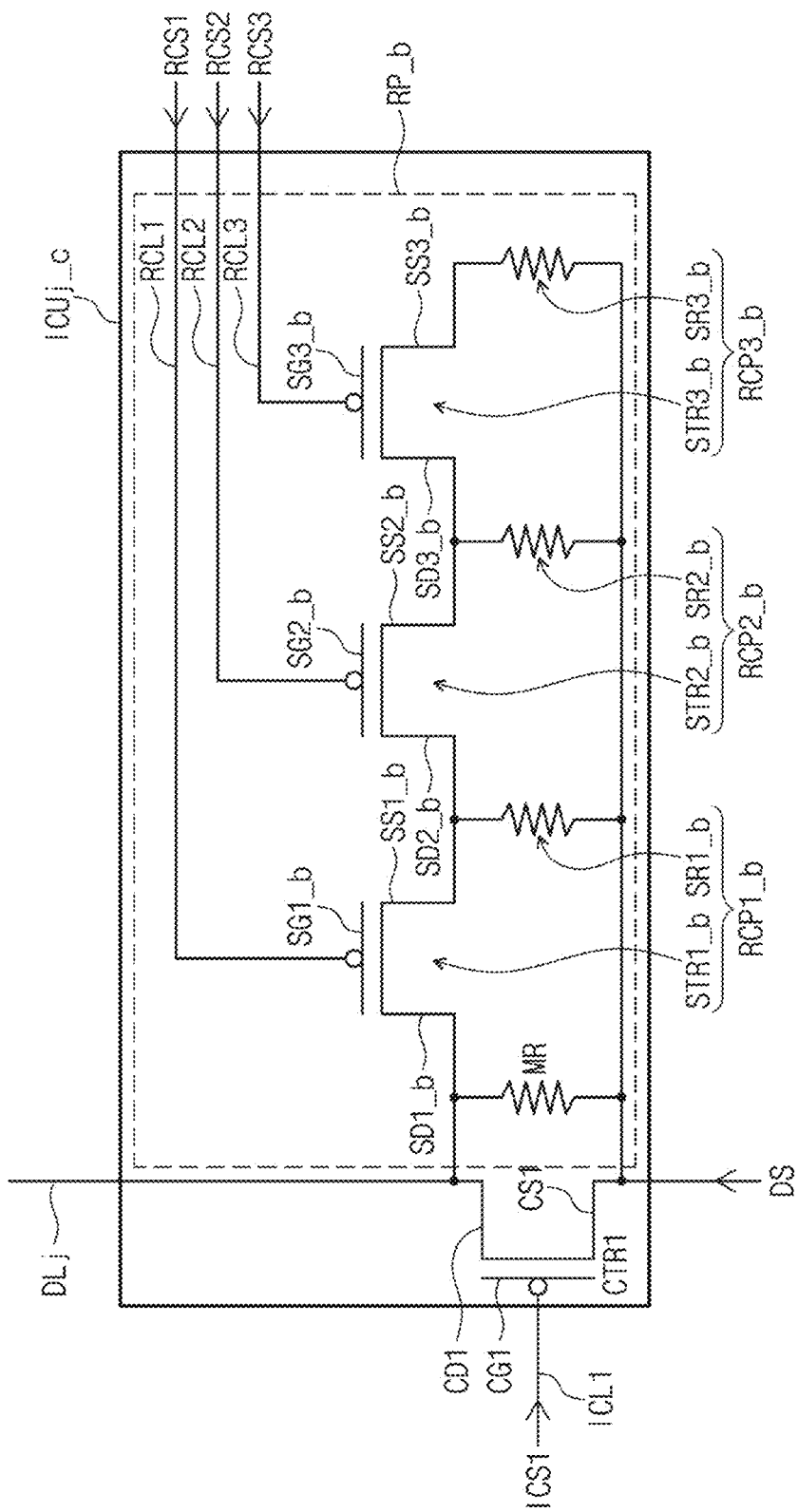

FIGS. 10A to 10C are circuit diagrams showing a structure of an impedance control unit including a resistor part.

In FIG. 10A, a j-th impedance control unit ICUj_a that is electrically connected with the j-th data line DLj is illustrated for convenience of illustration and description.

In an embodiment, the j-th impedance control unit ICUj_a may include a first control transistor CTR1 and a resistor part RP. In an embodiment, the first control transistor CTR1 is a P-type transistor. However, the disclosure is not limited thereto. In one alternative embodiment, for example, the first control transistor CTR1 may be an N-type transistor.

The first control transistor CTR1 is electrically connected with the j-th data line DLj. The first control transistor CTR1 is serially connected with the j-th data line DLj. The first control transistor CTR1 includes a first electrode, a second electrode, and a control electrode, the first electrode is referred to as a "source CS1", the second electrode is referred to as a "drain CD1", and the control electrode is referred to as a "gate CG1".

The source CS1 of the first control transistor CTR1 is electrically connected with the source driving block SDB (refer to FIG. 4). The drain CD1 of the first control transistor CTR1 is electrically connected with a j-th column of pixels PX1j to PXnj. The gate CG1 of the first control transistor CTR1 is electrically connected with an impedance control line ICL1.

In an embodiment, the resistor part RP may be connected in parallel with the first control transistor CTR1. A first end of the resistor part RP may be electrically connected with the source CS1 of the first control transistor CTR1, and a second end of the resistor part RP may be electrically connected with the drain CD1 of the first control transistor CTR1. In an embodiment, the resistor part RP may include a main resistor MR.

In an embodiment, a magnitude of the main resistor MR may be several to tens kilohms (kΩ). In an embodiment, the magnitude of the main resistor MR may be about 7 kΩ. However, the magnitude of the main resistor MR may vary depending on the size of the display device DD (refer to FIG. 1) and the placement of the pixels PX11 to PXnm (refer to FIG. 4) included in the display panel DP (refer to FIG. 4).

Referring to FIGS. 4, 9, and 10A, in an embodiment, the impedance control signal ICS (refer to FIG. 7) may include a first control signal ICS1. The first control signal ICS1 is supplied to the impedance control line ICL1. When the first control transistor CTR1 is turned off in the control period CW, the data signal DS supplied to the j-th data line DLj passes through the main resistor MR. When the first control transistor CTR1 is turned on in the non-control period NCW, the data signal DS supplied to the j-th data line DLj passes through the first control transistor CTR1. The j-th impedance control unit ICUj_a connected with the j-th data line DLj may have a first impedance in the control period CW and may have a second impedance in the non-control period NCW. In an embodiment, the first impedance may be greater than the second impedance.

Accordingly, an impedance of the j-th data line DLj may be adjusted through the j-th impedance control unit ICUj_a. In an embodiment, in the control period CW, the j-th data line DLj may have an impedance value including the main resistor MR. The j-th impedance control unit ICUj_a may allow a magnitude of the impedance of the j-th data line DLj and a magnitude of the impedance of the first power line RL1 to become substantially equal to each other, and thus, it may be possible to prevent the luminance of pixels PX1j to PXnj of the j-th column from being distorted due to the noise component induced by the external input TC.

Referring to FIG. 10B, in an embodiment of the j-th impedance control unit ICUj_b, a resistor part RP_a may include the main resistor MR, and a plurality of resistor adjusting parts RCP1_a, RCP2_a, and RCP3_a. in FIG. 10B, the same or like components as the components described with reference to FIG. 10A are labeled with the same reference characters, and thus, any repetitive detailed description thereof will be omitted or simplified.

The plurality of resistor adjusting parts RCP1_a, RCP2_a, and RCP3_a may be connected between the source CS1 and the drain CD1 of the first control transistor CTR1.

The resistor adjusting parts RCP1_a, RCP2_a, and RCP3_a may include sub-resistors SR1_a, SR2_a, and SR3_a and sub-transistors STR1_a, STR2_a, and STR3_a.

In an embodiment, the resistor adjusting parts RCP1_a, RCP2_a, and RCP3_a may include a first resistor adjusting part RCP1_a, a second resistor adjusting part RCP2_a, and a third resistor adjusting part RCP3_a.

The first resistor adjusting part RCP1_a includes a first sub-resistor SR1_a connected in parallel with the main resistor MR and a first sub-transistor STR1_a connected between the main resistor MR and the first sub-resistor SR1_a. A source SS1_a of the first sub-transistor STR1_a is electrically connected with the first sub-resistor SR1_a. A drain SD1_a of the first sub-transistor STR1_a is electrically connected with the main resistor MR. A control electrode SG1_a of the first sub-transistor STR1_a is connected with a first resistor control line RCL1 and is controlled in response to a first resistor control line RCS1.

The second resistor adjusting part RCP2_a includes a second sub-resistor SR2_a connected in parallel with the main resistor MR and a second sub-transistor STR2_a connected between the main resistor MR and the second sub-resistor SR2_a. A source SS2_a of the second sub-transistor STR2_a is electrically connected with the second sub-resistor SR2_a. A drain SD2_a of the second sub-transistor STR2_a is electrically connected with the main resistor MR. A control electrode SG2_a of the second sub-transistor STR2_a is connected with a second resistor control line RCL2 and is controlled in response to a second resistor control signal RCS2.

The third resistor adjusting part RCP3_a includes a third sub-resistor SR3_a connected in parallel with the main resistor MR and a third sub-transistor STR3_a connected between the main resistor MR and the third sub-resistor SR3_a. A source SS3_a of the third sub-transistor STR3_a is electrically connected with the third sub-resistor SR3_a. A drain SD3_a of the third sub-transistor STR3_a is electrically connected with the main resistor MR. A control electrode SG3_a of the third sub-transistor STR3_a is connected with a third resistor control line RCL3 and is controlled in response to a third resistor control signal RCS3.

An impedance of the j-th impedance control unit ICUj_b may be controlled by the first to third resistor control signals RCS1, RCS2, and RCS3. Accordingly, an impedance of the j-th data line DLj may also be controlled by the first to third resistor control signals RCS1, RCS2, and RCS3.

Referring to FIG. 10C, in an embodiment of the j-th impedance control unit ICUj_c, a resistor part RP_b may include the main resistor MR, and a plurality of resistor adjusting parts RCP1_b, RCP2_b, and RCP3_b. In an embodiment, the resistor adjusting parts RCP1_b, RCP2_b, and RCP3_b may include the first resistor adjusting part RCP1_b, the second resistor adjusting part RCP2_b, and the third resistor adjusting part RCP3_b. In FIG. 10C, the same or like components the components described with reference to FIGS. 10A and 10B are labeled with the same or like reference characters, and thus, any repetitive detailed description thereof will be omitted or simplified.

The second resistor adjusting part RCP2_b includes a second sub-resistor SR2_b connected in parallel with a first sub-resistor SR1_b and a second sub-transistor STR2_b connected between the first sub-resistor SR1_b and the second sub-resistor SR2_b. A source SS2_b of the second sub-transistor STR2_b is electrically connected with the second sub-resistor SR2_b. A drain SD2_b of the second sub-transistor STR2_b is electrically connected with the first sub-resistor SR1_b. A control electrode SG2_b of the second sub-transistor STR2_b is connected with the second resistor control line RCL2 and is controlled in response to the second resistor control signal RCS2.

The third resistor adjusting part RCP3_b includes a third sub-resistor SR3_b connected in parallel with the second sub-resistor SR2_b and a third sub-transistor STR3_b connected between the second sub-resistor SR2_b and the third sub-resistor SR3_b. A source SS3_b of the third sub-transistor STR3_b is electrically connected with the third sub-resistor SR3_b. A drain SD3_b of the third sub-transistor STR3_b is electrically connected with the second sub-resistor SR2_b. A control electrode SG3_b of the third sub-transistor STR3_b is connected with a third resistor control line RCL3 and is controlled in response to a third resistor control signal RCS3.

Figure 11:
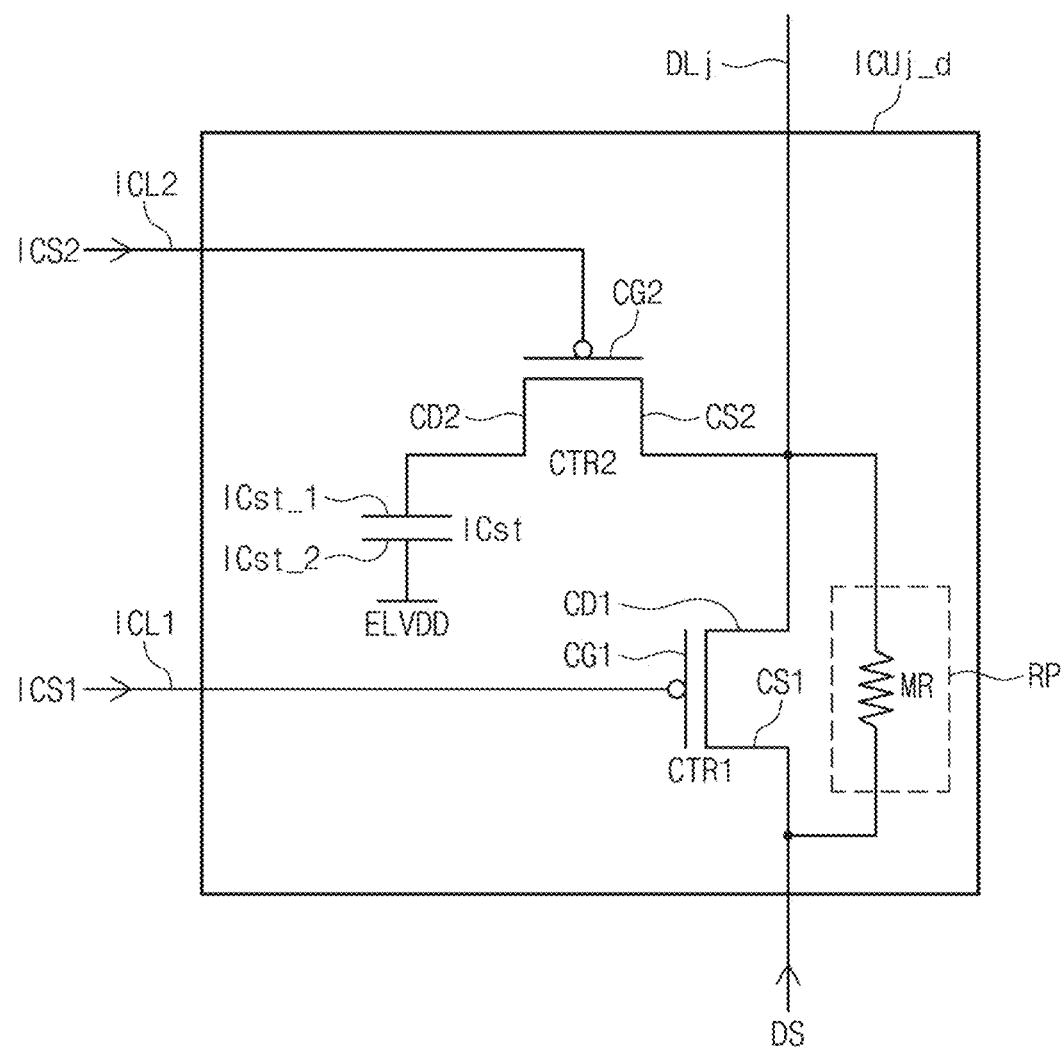
FIGS. 11 and 12 are circuit diagrams showing a structure of an impedance control unit including a resistor part and a capacitor.
Figure 12:
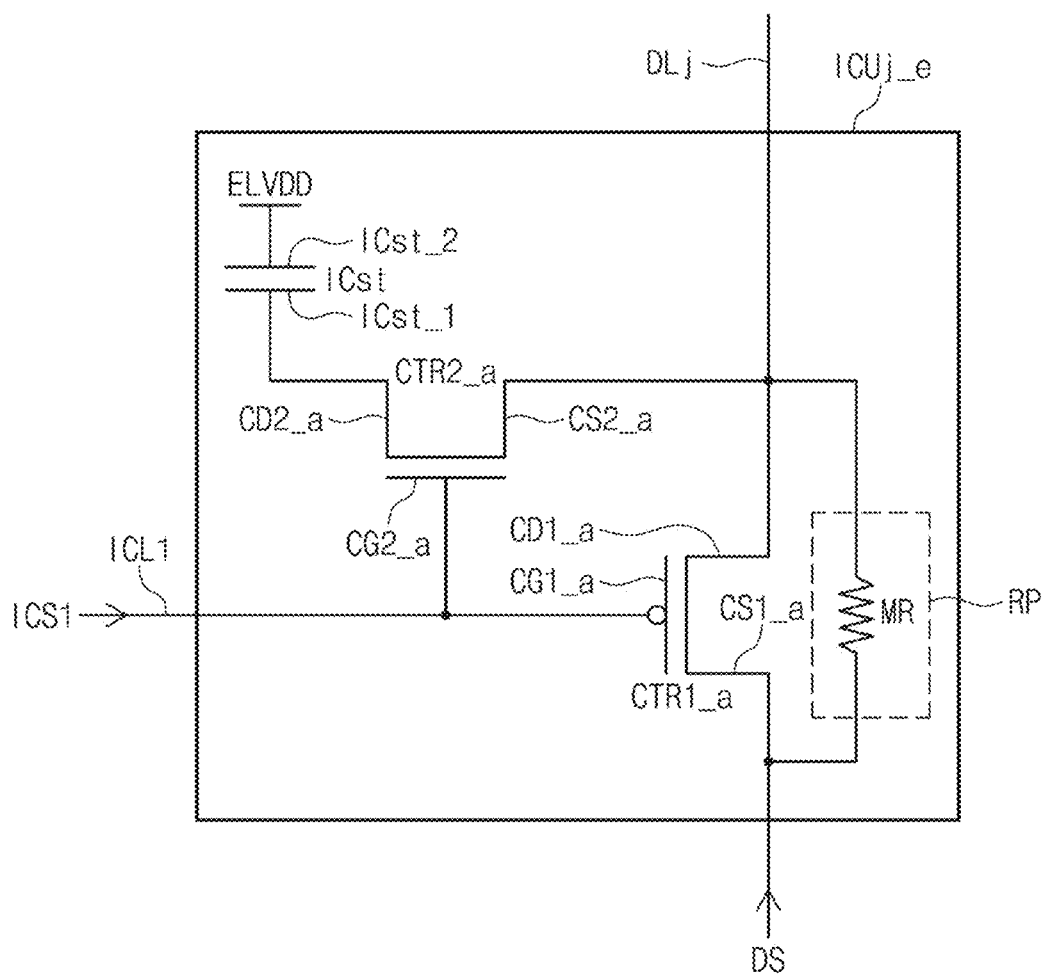

FIGS. 11 and 12 are circuit diagrams showing a structure of an impedance control unit including a resistor part and a capacitor.

Referring to FIG. 11, In an embodiment, the impedance control signal ICS (refer to FIG. 7) further includes a second control signal ICS2.

An embodiment of the j-th impedance control unit ICUj_d may further include a first control transistor CTR1, a main resistor MR, a second control transistor CTR2, and a capacitor ICst. In FIG. 11, the same or like components and signals as the components and signals described with reference to FIG. 10A are labeled with the same or like reference characters, and thus, any repetitive detailed description thereof will be omitted or simplified.

The second control transistor CTR2 is electrically connected with the j-th data line DLj. The second control transistor CTR2 is connected in parallel with the j-th data line DLj. The second control transistor CTR2 includes a first electrode, a second electrode, and a control electrode, the first electrode is referred to as a "source CS2", the second electrode is referred to as a "drain CD2", and the control electrode is referred to as a "gate CG2".

In an embodiment, the capacitor ICst may be electrically connected with the second control transistor CTR2. The source CS2 of the second control transistor CTR2 is electrically connected with the j-th data line DLj. The drain CD2 of the second control transistor CTR2 is electrically connected with a first electrode ICst_1 of the capacitor ICst. The gate CG2 of the second control transistor CTR2 is electrically connected with a second impedance control line ICL2. In an embodiment, a second electrode ICst_2 of the capacitor ICst may be electrically connected with the first power line RL1 (refer to FIG. 7). However, the disclosure is not limited thereto. In an alternative embodiment, the second electrode ICst_2 may be electrically connected with the second power line RL2 (refer to FIG. 7) or may be grounded.

In an embodiment, a capacitance of the capacitor ICst may be several to hundreds picofarads (pF).

In an embodiment, the first control signal ICS1 may have the high level in the control period CW (refer to FIG. 9) and may have the low level in the non-control period NCW (refer to FIG. 9). The second control signal ICS2 may have the low level in the control period CW and may have the high level in the non-control period NCW. The first control transistor CTR1 may be turned off in the control period CW and may be turned on in the non-control period NCW. The second control transistor CTR2 may be turned on in the control period CW and may be turned off in the non-control period NCW.

In an overlapping period in which the control period CW of the first control signal ICS1 and the control period CW of the second control signal ICS2 overlap each other, the j-th data line DLj may be electrically connected with the main resistor MR and the capacitor ICst. In an embodiment, a width of the control period CW of the first control signal ICS1 may be equal to a width of the control period CW of the second control signal ICS2.

Referring to FIG. 12, in an embodiment of the j-th impedance control unit ICUj e, a second control transistor CTR2_a may be an N-type transistor. A gate CG2_a of the second control transistor CTR2_a may be electrically connected with the first impedance control line ICL1. In such an embodiment, a first control transistor CTR1_a and the second control transistor CTR2_a may be controlled together by the first control signal ICS1.

In the control period CW of the first control signal ICS1, the first control transistor CTR1_a may be turned off, and the second control transistor CTR2_a may be turned on. In the non-control period NCW of the first control signal ICS1, the first control transistor CTR1_a may be turned on, and the second control transistor CTR2_a may be turned off.

In the control period CW of the first control signal ICS1, the j-th data line DLj may be electrically connected with the main resistor MR and the capacitor ICst.

Figure 13:
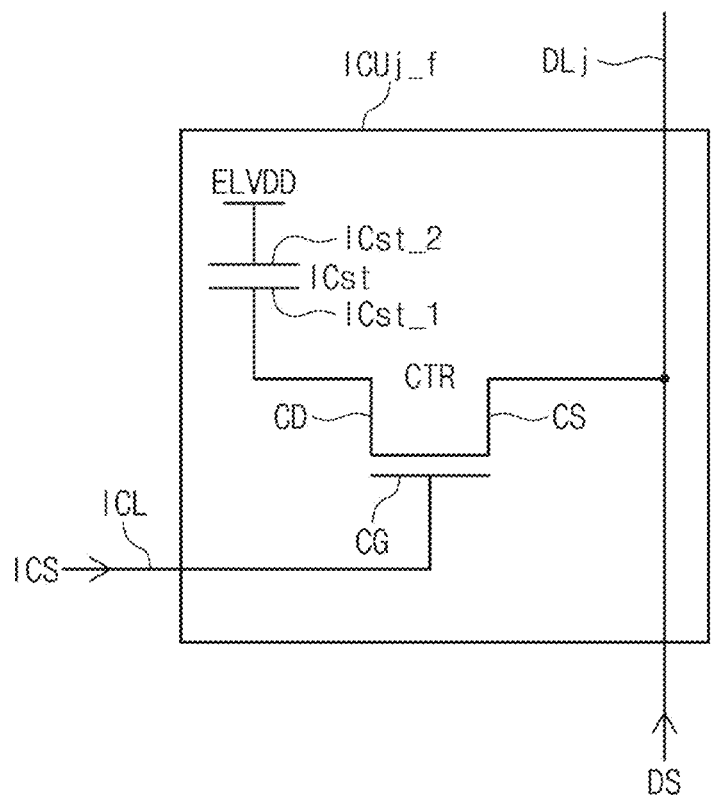
FIG. 13 is a circuit diagram showing a structure of an impedance control unit including a capacitor.

FIG. 13 is a circuit diagram showing a structure of an impedance control unit including a capacitor.

Referring to FIG. 13, In an embodiment, a j-th impedance control unit ICUj_f may include a control transistor CTR and a capacitor ICst.

The control transistor CTR is electrically connected with the j-th data line DLj. The control transistor CTR may be connected in parallel with the j-th data line DLj. The control transistor CTR includes a first electrode, a second electrode, and a control electrode, the first electrode is referred to as a "source CS", the second electrode is referred to as a "drain CD", and the control electrode is referred to as a "gate CG".

The source CS of the control transistor CTR is electrically connected with the j-th data line DLj. The drain CD of the control transistor CTR is electrically connected with the capacitor ICst. The gate CG of the control transistor CTR is electrically connected with an impedance control line ICL.

A first electrode ICst_1 of the capacitor ICst is electrically connected with the drain CD of the control transistor CTR. A second electrode ICst_2 of the capacitor ICst may be electrically connected with the first power line RL1 (refer to FIG. 7). However, the disclosure is not limited thereto. Alternatively, the second electrode ICst_2 may be electrically connected with the second power line RL2 (refer to FIG. 7) or may be grounded.

The control transistor CTR may be turned on in the control period CW (refer to FIG. 9) and may be turned off in the non-control period NCW (refer to FIG. 9). In the control period CW of the impedance control signal ICS, the j-th data line DLj may be electrically connected with the capacitor ICst.

The j-th impedance control unit ICUj_f connected with the j-th data line DLj may have a first impedance in the control period CW and may have a second impedance in the non-control period NCW. In an embodiment, the first impedance may be greater than the second impedance.

According to embodiments of the disclosure, luminance of a pixel may be effectively prevented from being distorted by an external input to a display device by controlling an impedance of a data line.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made thereto without departing from the spirit and scope of the invention as defined by the following claims.

What is claimed is:

1. A display device comprising:
a display panel including a plurality of pixels which displays an image and a plurality of data lines electrically connected with the pixels; and
a panel driving block which receives an image signal from an outside and transmits data signals to the display panel through the data lines,
wherein the display panel includes:
a plurality of impedance control units electrically connected with the data lines, respectively, wherein the impedance control units adjust an impedance of each of the data lines in response to an impedance control signal.

2. The display device of claim 1, wherein the impedance control signal controls the impedance control units based on a timing when the data signals are applied to the pixels.

3. The display device of claim 1, wherein the impedance control signal includes a first control signal, and
wherein each of the impedance control units includes:
a first control transistor connected with a corresponding data line among the data lines, wherein the first control transistor operates in response to the first control signal; and
a resistor part connected in parallel with the first control transistor.

4. The display device of claim 3,
wherein a first electrode of the first control transistor is electrically connected with a first end of the resistor part,
wherein a second electrode of the first control transistor is electrically connected with a second end of the resistor part,
wherein a control electrode of the first control transistor is electrically connected with a first impedance control line which receives the first control signal, and
wherein the first control transistor is turned off in a first control period of the first control signal and is turned on in a first non-control period of the first control signal.

5. The display device of claim 4, wherein the impedance control units have a first impedance in the first control period and have a second impedance smaller than the first impedance in the first non-control period.

6. The display device of claim 4, wherein the resistor part includes:
a main resistor connected between the first electrode of the first control transistor and the second electrode of the first control transistor.

7. The display device of claim 6, wherein the resistor part further includes:
a plurality of resistor adjusting parts connected between the first electrode of the first control transistor and the second electrode of the first control transistor,
wherein each of the resistor adjusting parts includes:
a sub-resistor connected between the first electrode of the first control transistor and the second electrode of the first control transistor; and
a sub-transistor connected between the second electrode of the first control transistor and the sub-resistor.

8. The display device of claim 7, wherein a control electrode of the sub-transistor is electrically connected with a resistor control line which receives a resistor control signal.

9. The display device of claim 4, wherein the impedance control signal further includes a second control signal,
wherein each of the impedance control units further includes:
a second control transistor connected in parallel with the corresponding data line, wherein the second control transistor operates in response to the second control signal; and
a capacitor connected with the second control transistor, and wherein a first electrode of the second control transistor is electrically connected with the corresponding data line, and a second electrode of the second control transistor is electrically connected with the capacitor.

10. The display device of claim 9,
wherein a control electrode of the second control transistor is electrically connected with a second impedance control line which receives the second control signal, and wherein the second control transistor is turned on in a second control period of the second control signal and is turned off in a second non-control period of the second control signal.

11. The display device of claim 10, wherein, in an overlapping period in which the first control period and the second control period overlap each other, each of the data lines is electrically connected with the resistor part and the capacitor.

12. The display device of claim 4, wherein each of the impedance control units further includes:
a second control transistor connected in parallel with the corresponding data line, wherein the second control transistor operates in response to the first control signal; and a capacitor connected with the second control transistor, and wherein a first electrode of the second control transistor is electrically connected with the corresponding data line, and a second electrode of the second control transistor is electrically connected with the capacitor.

13. The display device of claim 12,
wherein a control electrode of the second control transistor is electrically connected with the first impedance control line, and wherein the second control transistor is turned on in the first control period of the first control signal and is turned off in the first non-control period of the first control signal.

14. The display device of claim 13, wherein, in the first control period, each of the data lines is electrically connected with the resistor part and the capacitor.

15. The display device of claim 1, wherein each of the impedance control units includes:
a control transistor connected with a corresponding data line among the data lines, wherein the control transistor operates in response to the impedance control signal; and a capacitor connected with the control transistor, and wherein a first electrode of the control transistor is electrically connected with the corresponding data line, and a second electrode of the control transistor is electrically connected with the capacitor.

16. The display device of claim 15,
wherein a control electrode of the control transistor is electrically connected with an impedance control line which receives the impedance control signal, and wherein the control transistor is turned on in a control period of the impedance control signal and is turned off in a non-control period of the impedance control signal.

17. The display device of claim 16, wherein the impedance control units have a first impedance in the control period and have a second impedance smaller than the first impedance in the non-control period.

18. The display device of claim 1,
wherein the display panel includes a display area in which the pixels are disposed and a non-display area adjacent to the display area, and wherein the impedance control units are disposed in the non-display area.

19. The display device of claim 18, wherein the panel driving block includes:
a controller which generates a source control signal and a gate control signal and generates image data based on the image signal; and a source driving block which receives the source control signal and the image data from the controller and generates the data signal based on the image data, and wherein the impedance control units are disposed between the source driving block and the pixels.

20. The display device of claim 19, wherein the display panel further includes:
a plurality of scan lines electrically connected with the pixels, respectively, wherein the panel driving block further includes:
a gate driving block which sequentially transmits a scan signal, which is generated based on the gate control signal, to the display panel through the scan lines, and wherein the gate driving block transmits the impedance control signal to the impedance control units.

21. The display device of claim 20,
wherein the impedance control units have a first impedance in a control period of the impedance control signal and have a second impedance smaller than the first impedance in a non-control period of the impedance control signal, and wherein the control period overlaps a scan period of the scan signal.

22. The display device of claim 21, wherein the scan period is included in the control period.

23. The display device of claim 1, wherein the display panel includes:
a base layer;
a circuit element layer disposed on the base layer and including a plurality of driving transistors for driving a light-emitting element; and
a display element layer disposed on the circuit element layer and including the light-emitting element, wherein each of the impedance control units includes:
an impedance part; and
a control transistor which controls the impedance part, and
wherein the impedance part and the control transistor are disposed in the circuit element layer.

24. The display device of claim 23, wherein the impedance part is disposed in a same layer as a semiconductor pattern of a driving transistor among the driving transistors.

25. The display device of claim 24, wherein the impedance part includes polysilicon.

26. The display device of claim 25, wherein the impedance part includes metal oxide.

27. A display device comprising:
a display panel including a plurality of pixels which displays an image and a plurality of data lines electrically connected with the pixels;

an input sensing layer disposed on the display panel, wherein the input sensing layer senses an input applied from an outside; and a panel driving block which receives an image signal from the outside and transmits a data signal to the display panel through the data lines, wherein the display panel includes:
a plurality of impedance control units electrically connected with the data lines, respectively, wherein the impedance control units adjust an impedance of each of the data lines in response to an impedance control signal.

28. The display device of claim 27, wherein the display panel includes:
a display element layer including a light-emitting element; and
an encapsulation layer disposed on the display element layer.

29. The display device of claim 28, wherein the input sensing layer is disposed directly on the encapsulation layer.

30. The display device of claim 27,
wherein the display panel includes a display area in which the pixels are disposed and a non-display area adjacent to the display area, and
wherein the impedance control units are disposed in the non-display area.

31. The display device of claim 30, wherein the panel driving block further includes:
a controller which generates a source control signal and a gate control signal and generates image data based on the image signal; and
a source driving block which receives the source control signal and the image data from the controller and generates the data signal based on the image data, and
wherein the impedance control units are disposed between the source driving block and the pixels.

32. The display device of claim 31, wherein the display panel further includes:
a plurality of scan lines electrically connected with the pixels,
wherein the panel driving block further includes:
a gate driving block which sequentially transmits a scan signal, which is generated based on the gate control signal, to the display panel through the scan lines, and
wherein the gate driving block transmits the impedance control signal to the impedance control units.

* * * * *